(12) United States Patent
Yamauchi et al.

(10) Patent No.: US 6,836,001 B2
(45) Date of Patent: Dec. 28, 2004

(54) SEMICONDUCTOR DEVICE HAVING EPITAXIALLY-FILLED TRENCH AND METHOD FOR MANUFACTURING SEMICONDUCTOR DEVICE HAVING EPITAXIALLY-FILLED TRENCH

(75) Inventors: Shoichi Yamauchi, Obu (JP); Hitoshi Yamaguchi, Nisshin (JP); Jun Sakakibara, Anjo (JP); Nobuhiro Tsuji, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/442,196

(22) Filed: May 21, 2003

(65) Prior Publication Data
US 2003/0219933 A1 Nov. 27, 2003

(30) Foreign Application Priority Data

May 22, 2002 (JP) ...................................... 2002-148090
May 12, 2003 (JP) ...................................... 2003-133255

(51) Int. Cl.[7] .......................... H01L 29/04; H01L 29/76
(52) U.S. Cl. ........................ 257/627; 257/64; 257/330; 257/521
(58) Field of Search ............................... 257/327–334, 257/64, 255, 521, 627, 628

(56) References Cited

U.S. PATENT DOCUMENTS

| 4,466,173 A | 8/1984 | Baliga |
| 4,528,745 A | 7/1985 | Muraoka et al. |
| 5,828,101 A | * 10/1998 | Endo .......................... 257/330 |
| 6,498,368 B2 | 12/2002 | Sakamoto et al. |
| 6,525,375 B1 | 2/2003 | Yamaguchi et al. |
| 6,639,260 B2 | 10/2003 | Suzuki et al. |
| 6,670,673 B2 | * 12/2003 | Sakakibara ................. 257/328 |
| 6,700,175 B1 | * 3/2004 | Kodama et al. ............. 257/489 |
| 2004/0016959 A1 | 1/2004 | Yamaguchi et al. |
| 2004/0026735 A1 | 2/2004 | Suzuki et al. |

FOREIGN PATENT DOCUMENTS

JP    A-2001-127289    5/2001

* cited by examiner

*Primary Examiner*—Ori Nadav
(74) *Attorney, Agent, or Firm*—Posz & Bethards, PLC

(57) ABSTRACT

A semiconductor device includes a semiconductor substrate and a semiconductor layer. The semiconductor substrate has a main surface that is an Si{100} surface. The substrate has a trench in the main surface. The semiconductor layer is located on surfaces defining the trench to have common crystallographic planes with the semiconductor substrate. The trench is defined by a bottom surface, two long sidewall surfaces that face each other, and two short sidewall surfaces that face each other. The bottom surface and the long sidewall surfaces are Si{100} surfaces.

1 Claim, 23 Drawing Sheets

TRENCH

FIG. 21

| SURFACES 50a | Si($\bar{1}11$) | Si($\bar{1}1\bar{1}$) |
|---|---|---|
| SURFACES 53a | Si(001) | Si(001) |
| TRENCH 50 // OF | (1) 70.5°, 109.5°, 54.7°, INDEXING CUT-OUT ($\bar{1}11$); labels: (110), 53a(001), 41, 50a($\bar{1}11$), 41c, 53b, 50b | (2) 125.2°, INDEXING CUT-OUT ($\bar{1}11$); labels: 53a(001), 41, 50a($\bar{1}1\bar{1}$), 53b, 41c, 50b |
| TRENCH 50 ⊥ OF | (3) 54.7°, 144.7°, INDEXING CUT-OUT ($\bar{2}11$); labels: 53a(001), 41, 50a($\bar{1}11$), 53b, 50b, 41c | (4) 125.2°, 35.2°, INDEXING CUT-OUT ($\bar{1}21$); labels: 53a(001), 41, 50a($\bar{1}1\bar{1}$), 50b, 41c, 53b |

| | FIRST & SECOND EMBODIMENT | PROPOSED METHOD | THIRD EMBODIMENT |
|---|---|---|---|
| MAIN SURFACE | Si (100) | Si (100) | Si (100) |
| CHANNEL PLANE | Si {100} | Si {111} | Si {100} |
| GATE ORIENTATION | INDEXING CUT-OUT: Si{100} | INDEXING CUT-OUT: Si{111} 70.5° | INDEXING CUT-OUT: Si{111} 54.7° |
| TRENCH STRUCTURE | Si {100} / Si {100} | Si {111} / Si {110} | 53a Si {100} 53c / Si {110} |
| ELECTRON MOBILITY | 600 cm²/V·s | 430 cm²/V·s | 600 cm²/V·s |
| DENSITY OF INTERFACE TRAP | 2×10¹⁰/cm² | 1.7×10¹¹/cm² | 2×10¹⁰/cm² |
| OXIDE FILM THICKNESS | SIDEWALL = BOTTOM | SIDEWALL > BOTTOM | SIDEWALL < BOTTOM |
| TRENCH FORMATION | DRY ETCHING | WET ETCHING | DRY ETCHING |

SEMICONDUCTOR DEVICE HAVING EPITAXIALLY-FILLED TRENCH AND METHOD FOR MANUFACTURING SEMICONDUCTOR DEVICE HAVING EPITAXIALLY-FILLED TRENCH

CROSS REFERENCE TO RELATED APPLICATION

This application is based on and incorporates herein by reference Japanese Patent Application No. 2002-148090 filed on May 22, 2002 and No. 2003-133255 filed on May 12, 2003.

BACKGROUND OF THE INVENTION

The present invention relates to a semiconductor device formed by filling a trench with an epitaxially grown film and to a method for manufacturing the device.

Such a semiconductor device is manufactured, for example, by: forming a trench defined by four sidewall surfaces, each of which is an Si{110} surface, or a surface of silicon on which a {110} plane is exposed, and a bottom surface, which is an Si(100) surface, or a surface of silicon on which a (100) plane is exposed, in an Si(100) surface of a silicon substrate; and depositing an epitaxially grown film to fill the trench. Specifically, the four sidewall surfaces defining the trench may be an Si(011) surface, an Si(0-1-1) surface, an Si(01-1) surface, and an Si(0-11) surface. The four surfaces of the sidewall surfaces are crystallographically equivalent to one another, but crystallographically differ from the bottom surface.

Alternatively, such a semiconductor device may also be manufactured by: forming a trench having four sidewall surfaces, each of which is an Si{111} surface, or a surface of silicon on which a {111} plane is exposed, and a bottom surface, which is an Si{110} surface, or a surface of silicon on which a {110} plane is exposed, in an Si{110} surface of a silicon substrate with an anisotropic wet etching using potassium hydroxide (KOH) aqueous solution; and depositing an epitaxially grown film to fill the trench, as disclosed in JP-A-2001-168327.

When a trench is formed with the anisotropic wet etching, the etch rate difference between the planes. Therefore, the plane orientations of the surfaces defining a trench are limited by the plane orientation of the surface of a substrate. As a result, each of the four sidewall surfaces and the bottom surface of the trench automatically become an Si{111} surface and an Si{110} surface, respectively.

The above technique for forming a trench can be applied to what is called a three-dimensional (3-D) structure MOSFET, which is disclosed in JP-A-2001-274398, and to a super junction MOSFET, which is disclosed in JP-A-2001-127289. In the 3-D structure MOSFET, a channel region has been formed such that a current mainly flows parallel to the surface of a substrate in the channel region, that is, the channel width direction, in which the width of the channel region is defined, is orthogonal to the surface of the substrate. The super junction MOSFET includes a p/n column layer.

Some 3-D structure MOSFETs and some super junction MOSFETs include a trench gate, which is a gate electrode formed on a sidewall surface of a trench with a gate oxide film therebetween. When a trench for a trench gate is formed, a trench defined by four sidewall surfaces, each of which is an Si{110} surface, and a bottom surface, which is an Si(100) surface, can be formed as well as the aforementioned trench filled with an epitaxially grown film if a silicon substrate having an Si(100) surface is used.

When a silicon substrate having an Si{110} surface is used, a trench for a trench gate can be formed using an anisotropic wet etching as well as the aforementioned trench filled with an epitaxially grown film, as disclosed in JP-A-2001-168327. In that case as well, the trench comes to have four sidewall surfaces, each of which is an Si{111} surface, and a bottom surface, which is an Si{110} surface.

A bar (-) should have been put above the corresponding numeral in order to show a crystallographic plane orientation. However, a bar is put before the corresponding numeral due to the restriction of notation in this specification. Braces { } means every crystallographically equivalent plane as in the ordinary notation system. For example, a {100} plane is any one of a (100) plane, a (010) plane, a (001) plane, a (-100) plane, a (0-10) plane, and a (00-1) plane.

In the semiconductor devices proposed in the above publications, there are three demands. The first demand is for suppressing the generation of crystallographic stress, or crystal defects, in an epitaxially grown film when the trench is filled with the epitaxially grown film. The generation of the crystal defects in the epitaxially grown film can be suppressed by removing the crystal defects existing in the surfaces defining the trench before the epitaxially grown film is formed. If crystal defects exist in the surfaces defining the trench, crystal defects are generated in the epitaxially grown film grown on the surfaces, too. Therefore, the generation of the crystal defects in the epitaxially grown film can be suppressed by removing the crystal defects existing in the surfaces defining the trench before the epitaxially grown film is formed.

Alternatively, the trench may be formed by wet etching, not by dry etching. Wet etching damages the surfaces defining the trench less than dry etching, so fewer crystal defects are generated in the surfaces defining the trench formed by wet etching. In addition, wet etching damages the silicon substrate less than dry etching, and wet etching generates fewer contamination layer, which is produced through the reaction. Therefore, the generation of the crystal defects in the epitaxially grown film can be more suppressed by forming the trench using wet etching than using dry etching.

The inventors of the present invention have conducted intensive studies on the cause of generating the crystal defects in order to obtain a method having the effect of suppressing the generation of crystal defects other than the aforementioned methods. The studies have shown that the difference in crystallographic plane between the bottom surface and the sidewall surfaces of the trench is one of the causes generating the crystal defects.

If the crystallographic plane exposed on the bottom surface of the trench differs from those on the sidewall surfaces of the trench, the growth rate of the epitaxially grown film becomes different between on the bottom surface and on the sidewall surfaces. Therefore, when the epitaxial grown film is formed, a stress is generated in the epitaxial grown film near the bottom corners of the trench. The stress causes the crystal defects.

The second demand is for increasing the breakdown voltage of the gate oxide film, on which the trench gate is formed. If a semiconductor device including a trench gate is manufactured by: forming a trench defined by four sidewall surfaces, each of which is an Si{110} surface, and a bottom surface, which is an Si(100) surface, in an Si(100) surface of a silicon substrate; and forming an gate oxide film on the four sidewall surfaces and the bottom surface by thermal oxidization, the gate oxide film becomes thinner on the bottom surface than on the sidewall surfaces. Therefore, the breakdown voltage of the gate oxide film is substantially determined by the thickness of the gate oxide film on the bottom surface. Thus, it is necessary to thicken the gate oxide film on the bottom surface in order to increase the breakdown voltage of the gate oxide film.

However, the semiconductor device is designed on the basis of the thickness of the gate oxide film on the sidewall surfaces because a channel region is formed in the sidewall surfaces. Therefore, it is difficult to thicken the gate oxide film only on the bottom surface without thickening the gate oxide film on the sidewall surfaces, if the trench is formed such that the above crystallographic planes are exposed on the sidewall surfaces and the bottom surface. From the standpoint of increasing the breakdown voltage of the gate oxide film, it is preferred that the thickness of the gate oxide film on the bottom surface be approximately equal to or thicker than those on the sidewall surfaces.

The third demand is for increasing the current flowing through the channel region without enlarging the chip size of a power device such as a 3-D structure MOSFET and a super junction MOSFET. The current flowing through the channel region is thought to be increased by increasing the cross-sectional area of the current passage. However, in that case, the chip sizes of the power devices becomes larger, so it is not preferable to increase the cross-sectional area of the current passage.

SUMMARY OF THE INVENTION

The present invention has been made in view of the above aspects. A first object of the present invention is to suppress the generation of crystal defects in an epitaxially grown film when a trench formed in a substrate is filled with the epitaxially grown film. A second object of the present invention is to increase the breakdown voltage of a gate oxide film in a semiconductor device including a trench gate. A third object of the present invention is to increase the current flowing through the channel region without enlarging the chip size of a power device such as a 3-D structure MOSFET and a super junction MOSFET.

To achieve the above objects, a semiconductor device according to the present invention includes a semiconductor substrate and a semiconductor layer. The semiconductor substrate has a main surface that is an Si{100} surface. The substrate has a trench in the main surface. The semiconductor layer is located on surfaces defining the trench to have common crystallographic planes with the semiconductor substrate. The trench is defined by a bottom surface, two long sidewall surfaces that face each other, and two short sidewall surfaces that face each other. The bottom surface and the long sidewall surfaces are Si{100} surfaces.

BRIEF DESCRIPTION OF THE DRAWINGS

The above and other objects, features and advantages of the present invention will become more apparent from the following detailed description made with reference to the accompanying drawings. In the drawings:

FIG. 21 is a table that shows the positional relations between the orientation flats, the crystallographic planes that are exposed on the surfaces defining epitaxial trenches, and the crystallographic planes that are exposed on the surfaces defining gate trenches of semiconductor wafers;

FIG. 22 is another table that shows the positional relations between the orientation flats, the crystallographic planes that are exposed on the surfaces defining epitaxial trenches, and the crystallographic planes that are exposed on the surfaces defining gate trenches of semiconductor wafers;

FIG. 23 is a table that shows the electron mobility in the channel plane, the interface trap, and the relation in the thickness of the gate oxide film between on the sidewall surfaces and on the bottom surfaces of the power MOSFETs according to the first, second, and third embodiments.

DETAILED DESCRIPTION OF THE PREFERRED EMBODIMENTS

The present invention will be described in detail with reference to various embodiments.

First Embodiment

Figure 1:
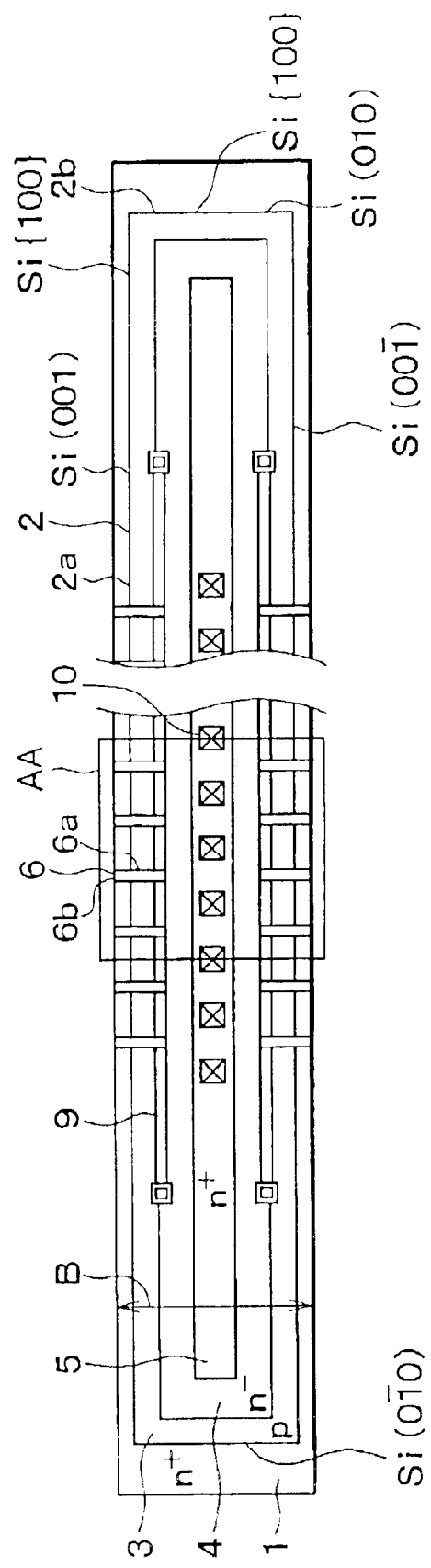
FIG. 1 is a schematic partial plan view of a 3-D structure power MOSFET as a first example of a first embodiment of the present invention.
Figure 2:
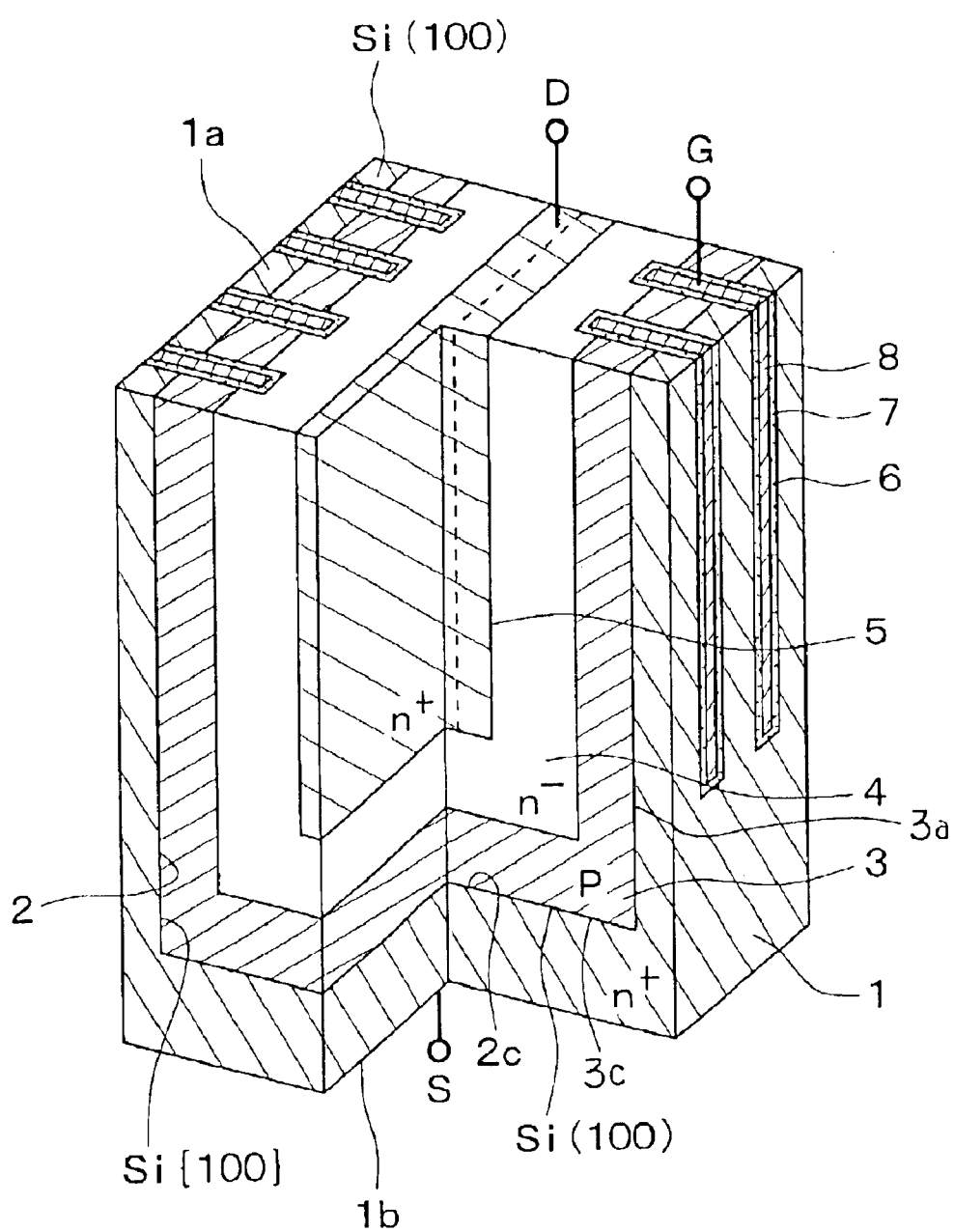
FIG. 2 is a schematic perspective sectional view of the MOSFET in FIG. 1 at the area AA.

FIG. 1 is a schematic partial plan view of a 3-D structure power MOSFET according to a first example of a first embodiment of the present invention. FIG. 2 is a schematic perspective sectional view of the MOSFET in FIG. 1 at the area AA. The power MOSFET has a structure in which the unit structure B of FIG. 1 is repeated a plurality of times.

The power MOSFET of FIG. 1 includes a semiconductor substrate 1, or an n$^+$-type substrate 1. The n$^+$-type substrate 1 has a main surface 1a, which is an Si(100) surface, and a rear surface 1b, which is opposite to the main surface 1a. The n$^+$-type substrate 1 is doped with P, As or Sb, which is an n-type impurity, at a concentration of about $1 \times 10^{18}$ to $1 \times 10^{20}$ cm$^{-3}$. The concentration of the impurity is substantially uniform along the directions orthogonal to the main surface 1a and the directions parallel to the main surface 1a. The n$^+$-type substrate 1 forms an n$^+$-type source region 1.

As shown in FIG. 2, a first trench 2, or an epitaxial trench 2, has been formed to have a predetermined depth of, for example, 1 to 100 μm from the main surface 1a of the n$^+$-type substrate 1. As described later, an epitaxially grown film has filled the epitaxial trench 2. As shown in FIG. 1, the epitaxial trench 2 is substantially square when viewed from above the main surface 1a. The epitaxial trench 2 is defined by long sidewall surfaces 2a and short sidewall surfaces 2b, and the long sidewall surfaces 2a and short sidewall surfaces 2b are Si{100} surfaces.

More specifically, one of the long sidewall surfaces 2a is an Si(001) surface and the other surface is an Si(00-1) surface. One of the short sidewall surfaces 2b is an Si(010) surface and the other surface is an Si(0-10) surface. The bottom surface 2c of the epitaxial trench 2 is parallel to the main surface 1a and is an Si(100) surface. Therefore, the surfaces defining the trench 2 are all Si{100} surfaces.

A p-type base region 3, or p-type well layer 3, has been formed in the trench 2. The p-type base region 3 has been doped with B, which is a p-type impurity, at a concentration of about $1 \times 10^{15}$ to $1 \times 10^{18}$ cm$^{-3}$ and has a thickness of about 0.1 to 5 μm. The concentration of the impurity in the p-type base region 3 is substantially uniform along the directions orthogonal to the main surface 1a and the directions parallel to the main surface 1a.

The sidewall surfaces 3a and the bottom surface 3c of the p-type base region 3 are the same crystallographic surfaces as the sidewall surfaces 2a, 2b and the bottom surface 2c of the trench 2, which are in contact with the sidewall surfaces 3a and the bottom surface 3c of the p-type base region 3, that is, Si{100} surfaces. The p-type base region 3 in the trench 2 has an aspect ratio, or the ratio of the dimension along the directions orthogonal to the main surface 1a to the dimension along the directions parallel to the main surface 1a, of 1 or more.

In general, the aspect ratio cannot be larger than 1 in the impurity region obtained by doping an impurity using ion implantation. However, as the p-type base region 3 is formed in the trench 2, the aspect ratio can become 1 or more. The same can be said of the following embodiments, which are described later.

As shown in FIG. 2, an n$^-$-type drift region 4 has been formed in the p-type base region 3. The n$^-$-type drift region 4 has been doped with P or As, which is an n-type impurity, at a concentration of about $1 \times 10^{14}$ to $1 \times 10^{17}$ cm$^{-3}$. The concentration of the impurity in the n$^-$ type drift region 4 is substantially uniform along the directions orthogonal to the main surface 1a and the directions parallel to the main surface 1a. The thickness of the n$^-$-type drift region 4 is determined, for example, in consideration of a required breakdown voltage.

An n$^+$-type drain region 5 has been formed in the n$^-$-type drift region 4. The n$^+$-type drain region 5 has been doped with P or As at a concentration of about $1 \times 10^{18}$ to $1 \times 10^{20}$ cm$^{-3}$ and has a thickness of about 0.1 to 5 μm. The concentration of the impurity in the n$^+$-type drain region 5 is substantially uniform along the directions orthogonal to the main surface 1a and the directions parallel to the main surface 1a.

As shown in FIG. 2, second trenches 6, or gate trenches 6, extend orthogonally from the main surface 1a of the n$^+$-type substrate 1. The gate trenches 6 also extend in the directions orthogonal to the long sidewall surfaces 2a of the epitaxial trench 2 formed in the n$^+$-type substrate 1 to intersect the p-type base region 3 from the n$^+$-type substrate 1 to the n$^-$-type drift region 4. As shown in FIG. 1, each of the gate trenches 6 is defined by long sidewall surfaces 6a and short sidewall surfaces 6b. Each of the long sidewall surfaces 6a is an Si(010) surface or an Si(0-10) surface, that is, an Si{100} surface.

A gate insulating film 7, or a gate oxide film 7, has been formed on the surfaces that define each of the gate trenches 6. The thickness of the gate oxide film 7 on the bottom surface of each of the gate trenches 6 is equal to those on the sidewall surfaces of each of the gate trenches 6. A gate electrode 8 has been formed on the gate oxide film 7 to fill each of the trenches 6.

With the above structure, the n$^+$-type source region 1, the p-type base region 3, the n$^-$-type drift region 4, and n$^+$-type drain region 5 are arranged sequentially in a direction parallel to the main surface 1a of the n$^+$-type substrate 1. The arrangement is maintained substantially down to the depth of the gate trenches 6 in the directions orthogonal to the main surface 1a of the n$^+$-type substrate 1. The depths of the p-type base region 3, the n$^-$-type drift region 4, and n$^+$-type drain region 5 are set corresponding to the depth of the trenches 6. That is, they become deeper as the trenches 6 become deeper.

As shown in FIG. 1, gate wiring lines 9 have been patterned on the main surface 1a of the n$^+$-type substrate 1 with an oxide film therebetween. The gate wiring lines 9 are electrically connected to the gate electrodes 8 through contact holes formed in the oxide film. Drain contact regions 10 have been formed in the n$^+$-type drain region 5. Although not shown in the figure, drain electrodes are located above the main surface 1a of the n$^+$-type substrate 1 with an inter-layer insulating film therebetween.

When a positive voltage is applied to the gate electrodes 8 of the thus constituted power MOSFET, electrons are induced in the p-type base region 3 at the entire surfaces adjacent to the gate oxide films 7 to form channel regions, which are inversion layers of the p-type base region 3. The channel regions are formed such that a current mainly flows parallel to the main surface 1a of the n$^+$-type substrate 1 in each of the channel regions, that is, the channel width direction is orthogonal to the main surface 1a of the n$^+$-type substrate 1.

In the power MOSFET of FIGS. 1 and 2, the gate oxide films 7 are located on the sidewall surfaces, which are Si{100} surfaces, of the gate trenches 6. In other words, the channel regions contact the gate insulating films 7 at Si{100} surfaces. Therefore, the interface traps at each of the interfaces between the channel regions and the gate insulating films 7 is lower in comparison with other structures, in which channel regions do not contact gate insulating films at Si{100} surfaces. Therefore, it is possible to improve the mobility of carriers in the channel regions. Thus, it is possible to increase the current flowing through the channel regions.

Next, the method for manufacturing the power MOSFET of FIGS. 1 and 2 will be described.

Figure 3A:
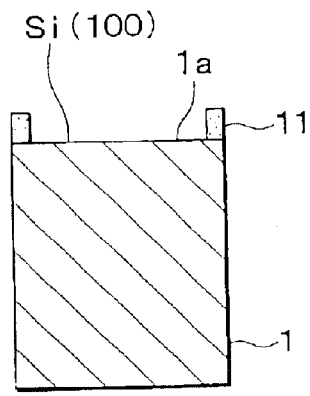
FIGS. 3A to 3E are views showing a method for manufacturing the 3-D structure power MOSFET of FIGS. 1 and 2.

[Steps Shown in FIG. 3A]

A semiconductor wafer 1, the main surface 1a of which is an Si(100) surface, is prepared. The semiconductor wafer 1 includes an $n^+$-type substrate 1, which forms an $n^+$-source region 1. A silicon oxide film 11 is formed on the $n^+$-type substrate 1 by thermal oxidation or CVD. The silicon oxide film 11 is etched at the area where a p-type base region 3 is formed by photolithography and etching.

Figure 3B:
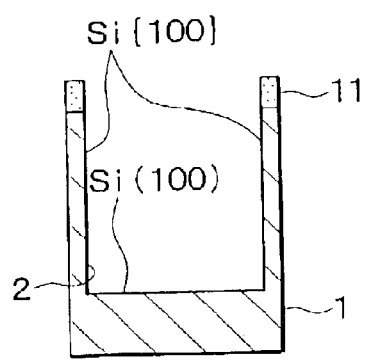

[Steps Shown in FIG. 3B]

An epitaxial trench 2 having a depth of 10 to 100 μm is formed by dry etching using the silicon oxide film 11 as a mask. The dry etching is carried out by exciting an etching gas into a plasma state with a bias voltage applied to the substrate 1. The etching gas includes, for example, $SF_6$ for protecting the sidewall surfaces of the epitaxial trench 2 and $CF_4$ for etching the bottom surface of the epitaxial trench 2. With the dry etching, the $n^+$-type substrate 1 is partially removed except the portion that becomes the $n^+$-type source region 1 to form the epitaxial trench 2.

Figure 4:
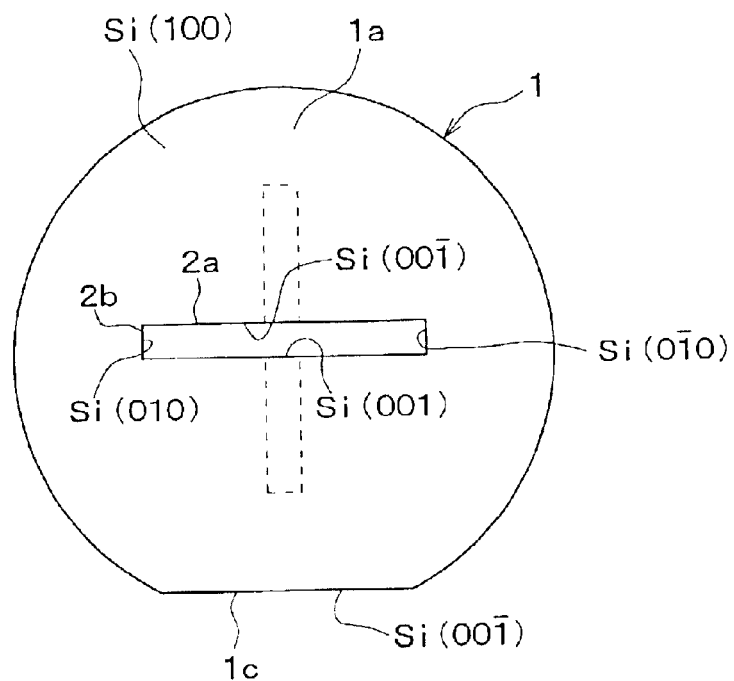
FIG. 4 is a plan view showing an arrangement of an epitaxial trench in a semiconductor wafer.

The method of selecting the plane orientations of the epitaxial trench 2 at the steps shown in FIG. 3A and FIG. 3B will be explained. For example, as shown in FIG. 4, when an indexing cut-out 1c, or an orientation flat 1c, of an Si(100) surface wafer 1, which has an Si(100) surface as a main surface 1a, is an Si(00-1) surface, the epitaxial trench 2 is formed to extend in the directions parallel to the orientation flat 1c, as shown by the solid lines in FIG. 4. With the above arrangement, the long sidewall surfaces 2a of the epitaxial trench 2 become an Si(001) surface and an Si(00-1) surface. The orientation flat 1C is a mark for specifying the surface orientations of the wafer 1 and may be a notch.

The short sidewall surfaces 2b of the epitaxial trench 2 are formed to extend in the directions orthogonal to the long sidewall surfaces 2a. With the arrangement, the short sidewall surfaces 2b become an Si(010) surface and an Si(0-10) surface. Consequently, all the sidewall surfaces of the epitaxial trench 2 become Si{100} surfaces. In addition, the bottom surface of the epitaxial trench 2 is formed to become parallel to the main surface 1a of the wafer 1, so the bottom surface is also an Si{100} surface.

The method of forming the epitaxial trench 2 is not limited to the above method. For example, as shown by the dotted lines in FIG. 4, the epitaxial trench 2 may be formed to become orthogonal to the orientation flat 1c. Since the sidewall surfaces of the epitaxial trench 2 shown by the dotted lines are all parallel to the sidewall surfaces of the epitaxial trench 2 shown by the solid lines, they are all Si{100} surfaces.

Figure 5:
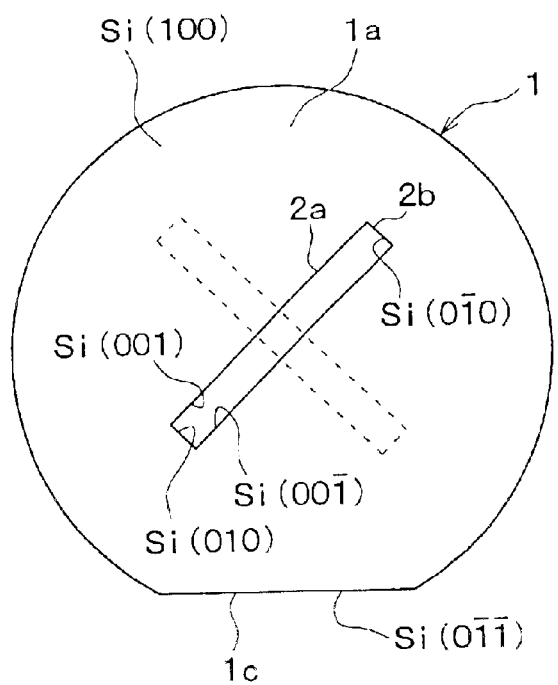
FIG. 5 is a plan view showing another arrangement of an epitaxial trench in a semiconductor wafer.

Alternatively, when the orientation flat 1c is formed to become an Si(0-1-1) surface as shown in FIG. 5, the epitaxial trench 2 may be formed to become at an angle of 45 degrees with the orientation flat 1c. More specifically, as shown by the solid lines in FIG. 5, the epitaxial trench 2 extends to make a 45-degree angle with the orientation flat 1c in the counterclockwise direction. In other words, the epitaxial trench 2 is formed such that the angles formed by the orientation flat 1c and the long sidewall surfaces 2a become 45 degrees.

Alternatively, as shown by the dotted lines in FIG. 5, the epitaxial trench 2 may extend to make a 135-degree angle with the orientation flat 1c in the counterclockwise direction. In other words, the epitaxial trench 2 may be formed such that the angles formed by the orientation flat 1c and the long sidewall surfaces 2a become 135 degrees. Even in that case, the acute angles formed by the orientation flat 1c and the long sidewall surfaces 2a become 45 degrees.

Figure 3C:
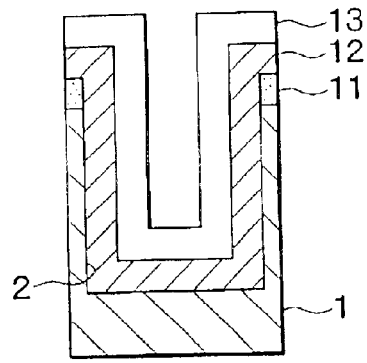

[Steps Shown in FIG. 3C]

The surfaces defining the epitaxial trench 2 are smoothed by heating in a non-oxidizing nitrogen atmosphere. Thereafter, a p-type film 12 is formed as a base-region-forming film 12 on the surfaces defining the epitaxial trench 2 by the epitaxial growth method. The p-type film 12 becomes the p-type base region 3. Incidentally, even after the mask oxide film 11 is removed with an etching using a hydrofluoric acid aqueous solution prior to the heat treatment in the non-oxidizing nitrogen atmosphere, the p-type film 12 can be formed likewise. The p-type film 12 grows orthogonally to Si{100} surfaces. In addition, the p-type film 12 is formed so that the epitaxial trench 2 is not completely filled. The reason is to form an $n^-$-type drift region 4 on the p-type film 12 in the epitaxial trench 2.

Then, an $n^-$-type film 13 is formed as a drift-region-forming film 13 by the epitaxial growth method to cover the p-type film 12. The $n^-$-type film 13 becomes the $n^-$-type drift region 4. Therefore, the $n^-$-type drift region 4 is also formed on Si{100} surfaces. The $n^-$-type film 13 is formed so that the epitaxial trench 2 is not completely filled.

Figure 3D:
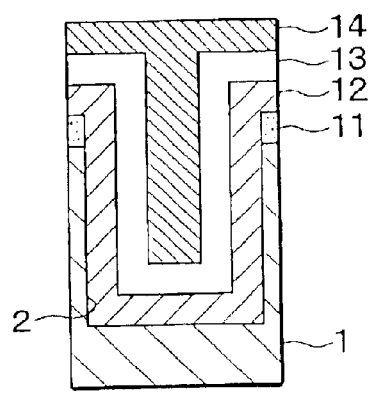

[Steps Shown in FIG. 3D]

Subsequently, an $n^+$-type film 14 is formed as a drain-region-forming film by the epitaxial growth method to cover the $n^-$-type film 13 and fill up the epitaxial trench 2. The $n^+$-type film 14 becomes the $n^+$-type drain region 5. Therefore, the $n^+$-type drain region 5 is also formed on an Si{100} surface. The growing surface of the $n^+$-type films 14 meats itself in the epitaxial trench 2 to completely fill the epitaxial trench 2, as shown in FIG. 3D.

Figure 3E:
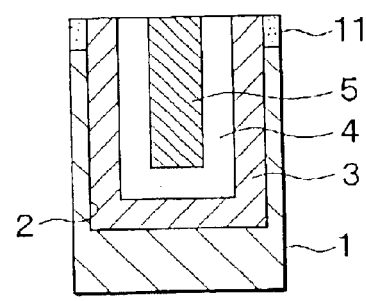

[Steps Shown in FIG. 3E]

After that, the wafer 1 is polished at the main surface 1a to planarize the wafer 1. In the polishing, the p-type film 12, the $n^-$-type film 13, and the $n^+$-type film 14 are planarized using, for example, the silicon oxide film 11 as an etching stopper. With the polishing, a p-type base region 3, an $n^-$-type drift region 4, and an $n^+$-drain region 5 are formed. Then, the gate trenches 6 of FIGS. 1 and 2, each of which extends orthogonally to the main surface 1a of the substrate 1 and is rectangular when viewed from above their entrances, are formed from the surface 1a of the substrate 1 by selective etching, although the steps are not shown in the figures.

The gate trenches 6 are formed in such a manner that they intersect the p-type base region 3 from the $n^+$-type source region 1, which is formed by the substrate 1, parallel to the surface 1a of the substrate 1. That is, the gate trenches 6 are formed to ensure that channel regions are formed in the p-type base region 3. In addition, the gate trenches 6 are formed to extend orthogonally to the long sidewall surfaces 2a of the epitaxial trench. With the structure, as shown in FIG. 1, the long sidewall surfaces 6a of each of the gate trenches 6 can respectively become an Si(010) surface and an Si(0-10) surface, that is, the long sidewall surfaces 6a become Si{100} surfaces. In other words, the surfaces of the p-type base region 3 that are exposed in the gate trenches 6 become Si{100} surfaces.

Subsequently, the gate oxide films 7 are formed in the gate trenches 6 by, for example, thermal oxidization, and an n⁺-type polysilicon film is deposited to fill the gate trenches 6 in order to form the gate electrodes 8. After a drain electrode, which becomes in electric contact with the n⁺-type drain region 5, and a source electrode, which becomes in electric contact with the n⁺-type source region 1, are respectively formed above the main surface 1a of the substrate 1 and on the rear surface 1b of the substrate 1, electric wiring lines are formed for electrically connecting the gate electrodes 8 and so on to an outside circuit. Finally, the substrate 1 is covered with a passivation film above the main surface 1a to complete a power MOSFET of FIGS. 1 and 2.

At the step shown in FIG. 3B, the epitaxial trench 2 is formed in the substrate 1 such that all the surfaces defining the epitaxial trench 2 become Si{100} surfaces. Therefore, when the p-type base region 3 is formed on the surfaces defining the epitaxial trench 2 by the epitaxial growth method at the step shown in FIG. 3C, the p-type film 12, which becomes the p-type base region 3, epitaxially grows on the bottom surface and the sidewall surfaces of the epitaxial trench 2 at the same growth rate. Therefore, the stress that is otherwise generated in the p-type base region 3 near the lower corners of the epitaxial trench 2 can be suppressed when the p-type base region is formed in the epitaxial trench 2. This makes it possible to suppress the generation of crystal defects in the p-type base region 3. As a result, the p-type base region 3 becomes to have an excellent crystallographic structure.

Conventionally, a semiconductor wafer that has an Si{100} surface as a main surface has had an Si{110} surface as an orientation flat. In addition, since an epitaxial trench has been formed parallel or orthogonally to the orientation flat, the sidewall surfaces of the epitaxial trench have been Si{110} surfaces.

It is known that when an epitaxial film is formed on a flat main surface of a substrate, the epitaxial film generally has a better crystallographic structure when the main surface is an Si{100} surface than when it is an Si{110} surface or an Si{111} surface. The reason is that the formation of a crystal nucleus proceeds stably on Si{100} surfaces during the epitaxial growth because Si{100} surfaces have a higher step density than Si{110} surfaces and Si{111} surfaces. Therefore, fewer crystal defects are generated when an epitaxial film grows on an Si{100} surface. In this embodiment, epitaxial films are formed on Si{100} surfaces. Therefore, the epitaxial films formed by the method of this embodiment have a better crystallographic structure than those formed by the above conventional method.

In addition, in this embodiment, the surfaces defining the epitaxial trench 2 are smoothed at the step shown in FIG. 3C before the p-type film 12 is formed by epitaxial growth. The reason is to remove crystal defects that exist in the surfaces defining the epitaxial trench 2. The present invention can be used in conjunction with another method for suppressing the generation of crystal defects as in this embodiment, so it is possible to further efficiently suppress the generation of crystal defects.

The p-type base region 3 is formed on an Si{100} surface, and the n⁻-type drift region 4 and the n⁺-type drain region 5 are sequentially formed on Si{100} surfaces. Therefore, the p-type base region 3, n⁻-type drift region 4, and n⁺-type drain region 5 become to have an excellent crystallographic structure.

Figure 6:
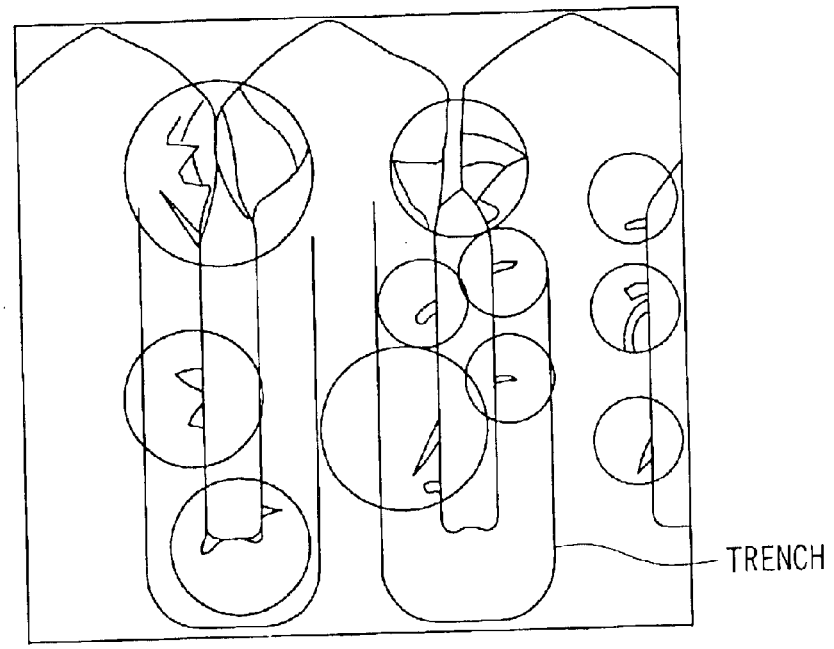
FIG. 6 is a schematic cross-sectional image, which is based on the observation using a scanning electron microscope, of an epitaxial film formed in a trench by a conventional method.
Figure 7:
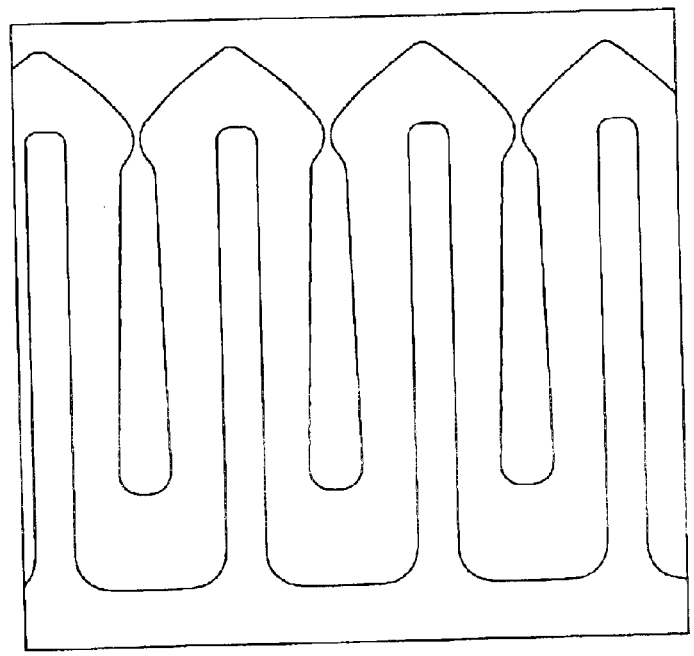
FIG. 7 is a schematic cross-sectional image, which is based on the observation using a scanning electron microscope, of an epitaxial film formed in a trench by the method according to the first embodiment.

FIG. 6 is a schematic cross-sectional image of an epitaxial film formed in a trench by the above-mentioned conventional method. The schematic cross-sectional image is based on the observation using a scanning electron microscope. FIG. 7 is also a schematic cross-sectional image of an epitaxial film formed in a trench by the method according to this embodiment. The figures have been obtained by making crystal defects prominent by stained etching the cross-section of each epitaxially grown sample with the mixture of hydrofluoric acid and nitric acid and observing it using a scanning electron microscope.

As shown in the circles of FIG. 6, the generation of crystal defects could be confirmed in the epitaxial film formed in a trench by the conventional method. In contrast to this, in the epitaxial film formed in a trench by the method according to this embodiment, no crystal defects were generated, as shown in FIG. 7. Thus, the inventors of the present invention confirmed that the generation of crystal defects can be suppressed by the method according to this embodiment.

In this embodiment, after the step of FIG. 3E, the gate trenches 6 are formed to extend orthogonally to the long sidewall surfaces 2a of the epitaxial trench 2. Since the long sidewall surfaces 2a of the epitaxial trench 2 are Si{100} surfaces, it is easy to make the long sidewall surfaces 6a of the gate trenches 6 Si{100} surfaces. That is, the surfaces of the channel regions that are in contact with the gate insulating films 7 can become Si{100} surfaces. Hereinafter, the surfaces of the channel regions that are in contact with the gate insulating films 7 are just referred to as the channel surfaces.

As shown in FIG. 23, when the channel surfaces are Si{100} surfaces, the density of the interface trap between the channel regions and the gate insulating films 7 is $2 \times 10^{10}$ cm$^{-2}$ and the carrier mobility, or the electron mobility, in the channel regions is 600 cm$^2$/V*s. That is, the density of the interface trap can be reduced by assigning Si{100} surfaces to the channel surfaces compared with the case that the channel surfaces are not Si{100} surfaces. Therefore, the loss of carriers in the channel regions can be reduced. In other words, the mobility of carriers in the channel regions can be improved. Therefore, it is possible to increase the currents that flow through the channel regions, so a larger amount of current can be applied between the source and the drain in an ON state.

In addition, the sidewall surfaces 6a, 6b and the bottom surfaces of the gate trenches 6 have crystallographically the same plane orientation, so it is possible to equate the thickness of the gate oxide films 7 on the sidewall surfaces 6a, 6b with that on the bottom surfaces when the gate oxide films 7 are formed on the surfaces defining the gate trenches 6 by thermal oxidization. Therefore, if the device design is made based on the thickness of the gate oxide films 7 on the sidewall surfaces 6a, 6b, it is possible to thicken the gate oxide films 7 on the bottom surfaces compared with the case that the main surface of a substrate is an Si(100) surface and the sidewall surfaces and the bottom surfaces are respectively Si{110} surfaces and Si{100} surfaces. Thus, it is possible to increase the breakdown voltage of the gate oxide films 7.

In this embodiment, the main surface of the substrate is an Si(100) surface, and the sidewall surfaces of the epitaxial trench 2 are an Si(001) surface, an Si(00-1) surface, an Si(010) surface, and an Si(0-10) surface. However, not limiting to the above surfaces, other surfaces may be used as long as they are Si{100} surfaces. The epitaxial trench 2 may be formed such that only a pair of long sidewall surfaces 2a are Si{100} surfaces. The total area of the short sidewall surfaces 2b of the epitaxial trench 2 formed in this semiconductor device is much smaller than that of the long sidewall surfaces 2a. Therefore, even if the epitaxial trench 2 is formed such that only the pair of long sidewall surfaces 2a are Si{100} surfaces, the effect of suppressing crystal defects can be obtained. Although the gate oxide films 7 are formed by thermal oxidization in this embodiment, the gate oxide films 7 may be formed by CVD.

Figure 8:
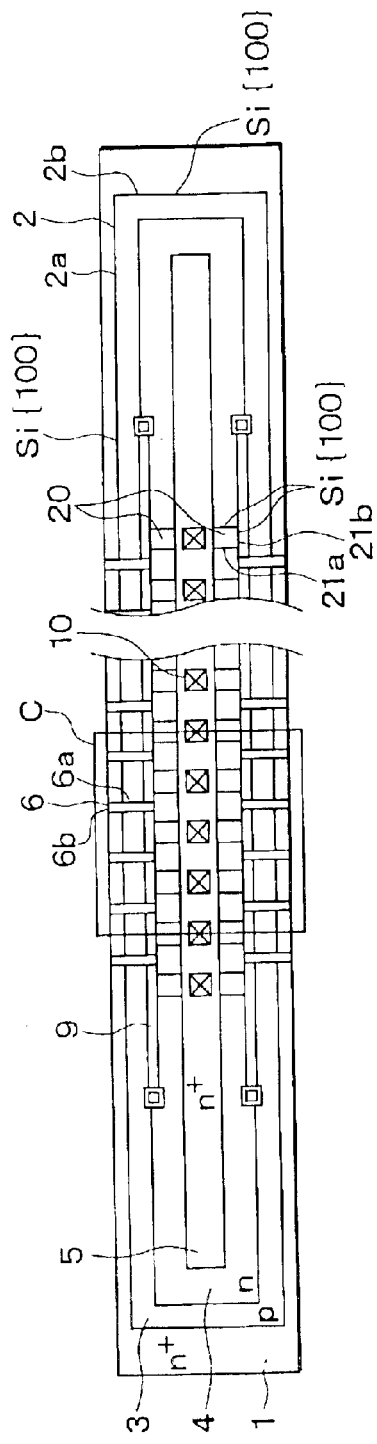
FIG. 8 is a plan view of a 3-D power MOSFET as a second example of the first embodiment.
Figure 9:
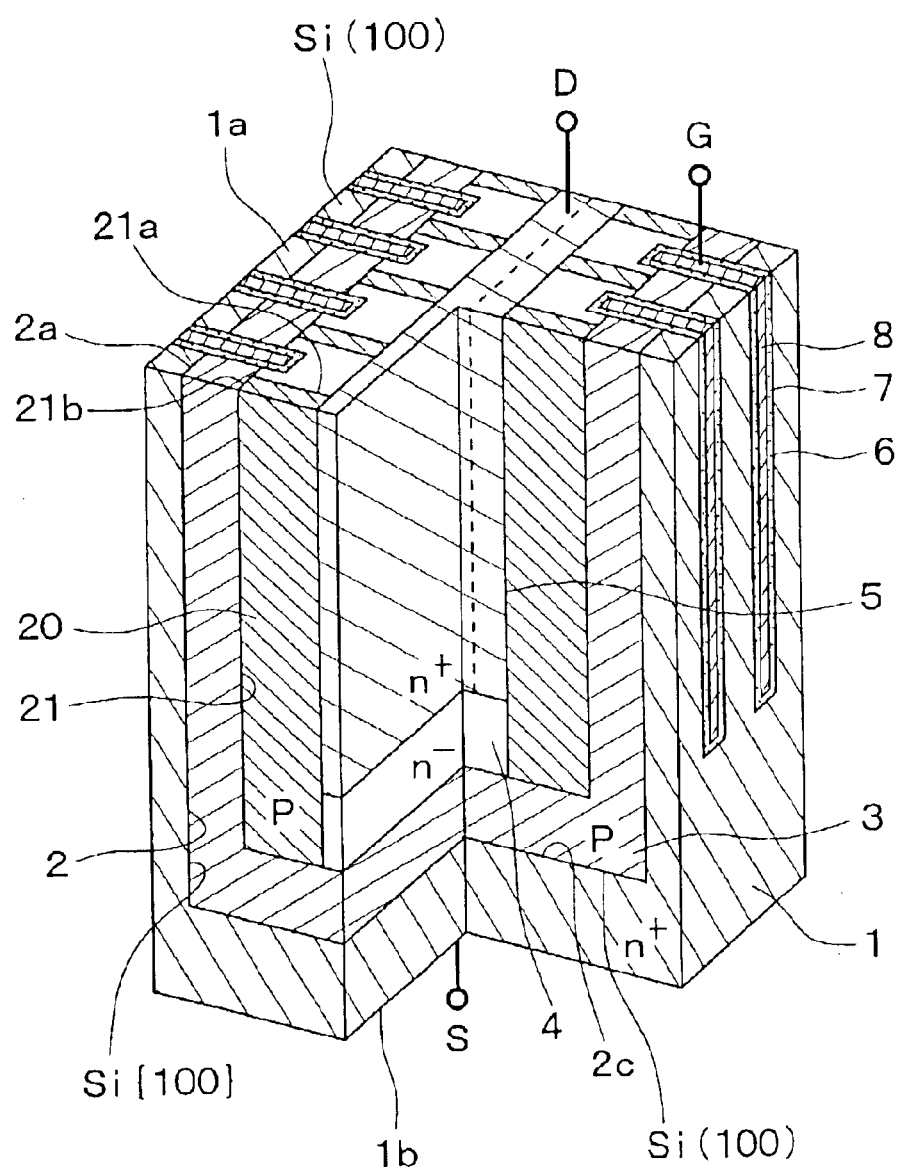
FIG. 9 is a perspective sectional view of the area C in FIG. 8.

FIG. 8 is a plan view of a 3-D power MOSFET as a second example of this embodiment. FIG. 9 is a perspective sectional view of the area C in FIG. 8. This power MOSFET has a super junction structure with p-type RESURF layers 20 unlike the power MOSFET of the first example. The p-type RESURF layers 20 are formed to extend vertically from the main surface 1a in the n⁻-type drift region 4 with a space therebetween, that is, in a striped pattern, and each of the p-type RESURF layers 20 extends parallel to the current flowing direction. In other words, the n⁻-type drift regions 4 and the p-type RESURF layers 20 are arranged alternately to form a p/n column layer. This power MOSFET is the same as the power MOSFET of the first example in other constitution, and the same elements are denoted using the same symbols as in the first example.

This power MOSFET is formed by adding the step of forming the p-type RESURF layers 20 to the process for manufacturing the power MOSFET of the first example. For example, after the step shown in FIG. 3E, a plurality of RESURF trenches 21 are formed to extend vertically from the main surface 1a in the drift region with a space therebetween. At that time, the RESURF trenches 21 are formed to extend orthogonally to the long sidewall surfaces 2a of the epitaxial trench 2. That is, the RESURF trenches 21 are formed such that the long sidewall surfaces 21a of the RESURF trenches 21 become orthogonal to the long sidewall surfaces 2a of the epitaxial trench 2 and the short sidewall surfaces 21b of the RESURF trenches 21 become parallel to the long sidewall surfaces 2a of the epitaxial trench 2.

With the above arrangement, all the sidewall surfaces of the RESURF trenches 21 become Si{100} surfaces. Since the bottom surfaces of the RESURF trenches 21 are formed parallel to the main surface 1a of the substrate, all the surfaces defining the RESURF trenches 21 are Si{100} surfaces. Thereafter, the p-type RESURF layers 20 are formed in the RESURF trenches 21 by the epitaxial growth method. Next, trench gates are formed in the same manner as in the first example.

In this second example, the p-type RESURF layers 20 are formed on the surfaces defining the RESURF trenches 21, which are all Si{100} surfaces. Therefore, the stress that is otherwise generated near the lower corners of the RESURF trench 21 can be reduced when the p-type RESURF layers 20 are formed in addition to the effect obtained in the power MOSFET of FIG. 1. In addition, since the p-type RESURF layers 20 are formed on Si{100} surfaces, they can have an excellent crystallographic structure.

Figure 10:
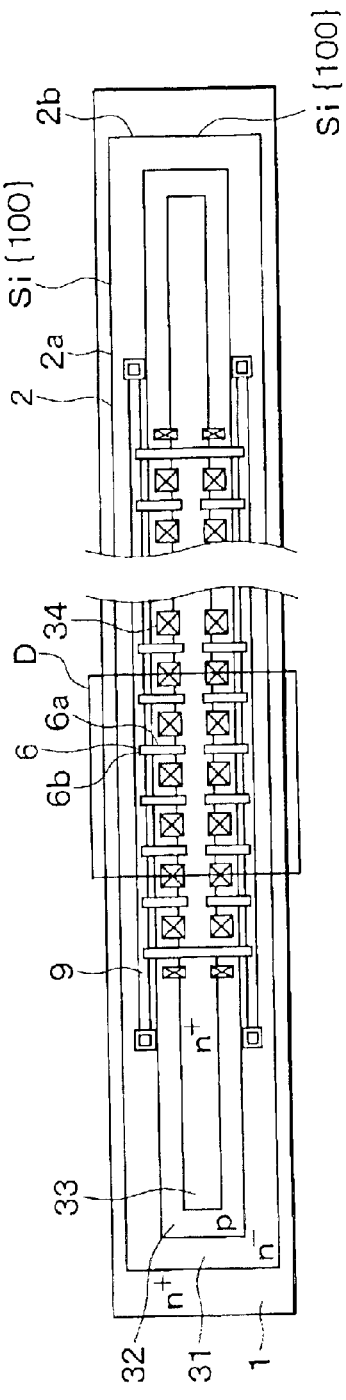
FIG. 10 is a plan view of a 3-D power MOSFET as a third example of the first embodiment.
Figure 11:
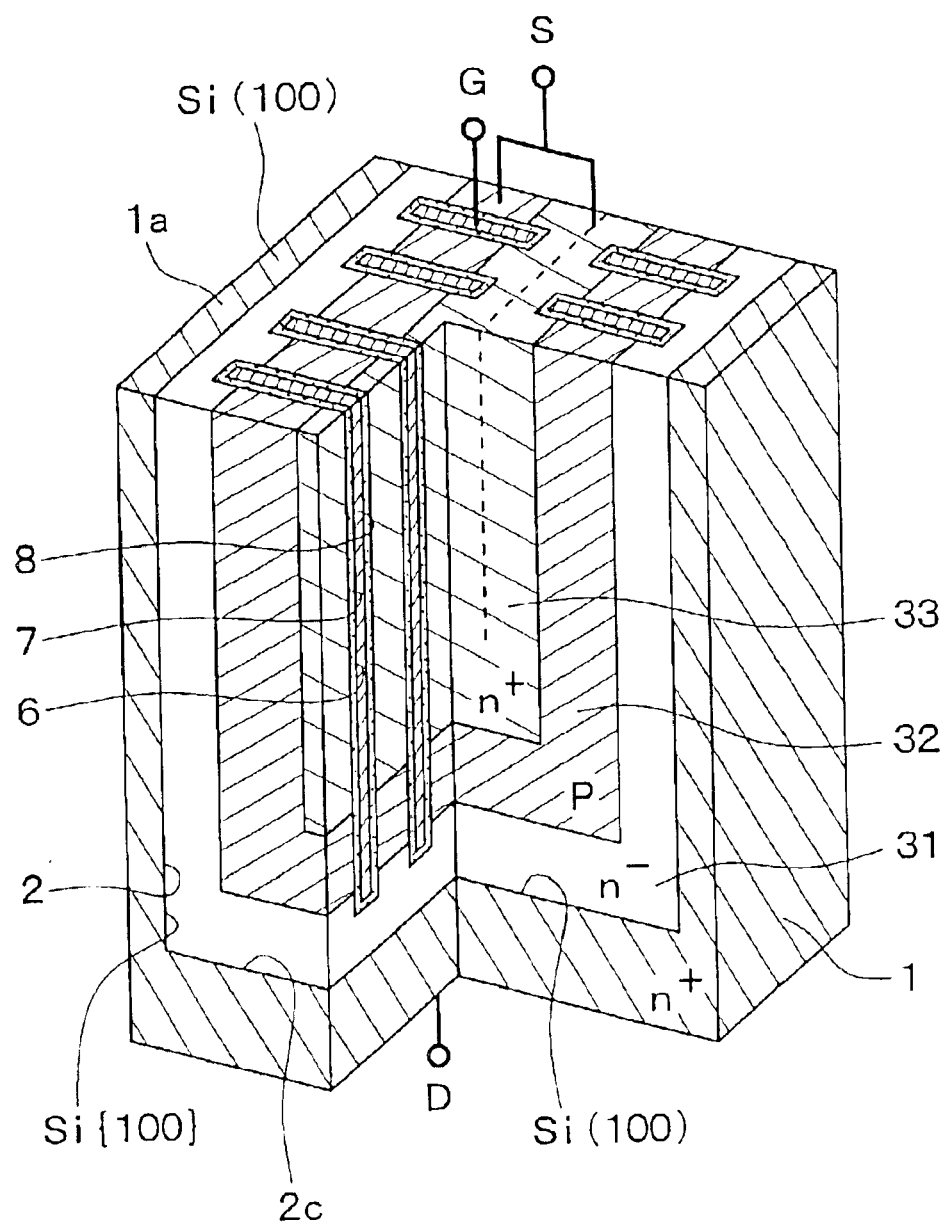
FIG. 11 is a perspective sectional view of the area D in FIG. 10.

FIG. 10 is a plan view of a 3-D power MOSFET as a third example of this embodiment. FIG. 11 is a perspective sectional view of the area D in FIG. 10. In the first example, the source region 1, the base region 3, the drift region 4, and the drain region 5 are formed sequentially from the outer side to the inner side. In contrast, in this power MOSFET, an n⁺-type substrate 1 that forms a drain region 1, an n⁻-type drift region 31, a p-type base region 32, and an n⁺-type source region 33 are formed sequentially from the outer side to the inner side.

Gate trenches 6 are formed to extend vertically from the main surface 1a of the n⁺-type substrate 1, that is, substantially parallel to the depth direction of the substrate. The gate trenches 6 intersect the p-type base region 32 from the n⁺-type source region 33 in a direction parallel to the main surface 1a of the n⁺-type substrate and the depth direction of the gate trenches 6. A gate electrode 8 is formed on the surfaces defining each of the trenches 6 with a gate insulating film 7 therebetween.

In this power MOSFET, the n⁻-type drift region 31 is formed on the surfaces defining an epitaxial trench 2, which has been formed in the n⁺-type substrate 1, the main surface 1a of which is on an Si(100) surface. Like the first example, the bottom surface 2c and the sidewall surfaces 2a, 2b of the epitaxial trench 2 are all Si{100} surfaces. Source contact regions 34 are formed in the n⁺-type source region 33. At the trench gates, as well as the first example, the surfaces in contact with the gate insulating films 7 of the base region 32 are Si{100} surfaces and have the same effect as in the first example.

Subsequently, the process for manufacturing this power MOSFET will be explained. In this example, after the epitaxial trench 2 is formed in the n⁺-type substrate 1, each layer is formed in the epitaxial trench 2 in a different order from that of the first example. First, an n⁺-type substrate 1 having an Si(100) surface as a main surface 1a is prepared. Thereafter, the epitaxial trench 2 having a predetermined depth is formed from the main surface 1a. The epitaxial trench 2 is formed in such a manner that the bottom surface 2c and the long sidewall surfaces 2a and the short sidewall surfaces 2b of the epitaxial trench 2 all become Si{100} surfaces.

Then, an n⁻-type drift region 31, a p-type base region 32, and an n⁺-type source region 33 are sequentially formed on the surfaces defining the epitaxial trench 2 by epitaxial growth. Subsequently, the gate trenches 6 are formed to extend from the n⁺-type source region 33 through the p-type base region 32 in the directions orthogonal to the long sidewall surfaces 2a of the epitaxial trench 2 and in the depth direction of the substrate. Next, gate insulating films 7 and gate electrodes 8 are sequentially formed. Source contact regions 34 are formed in the n⁺-type source region 33. The process for manufacturing this power MOSFET has the same effect as in the first example.

Figure 12:
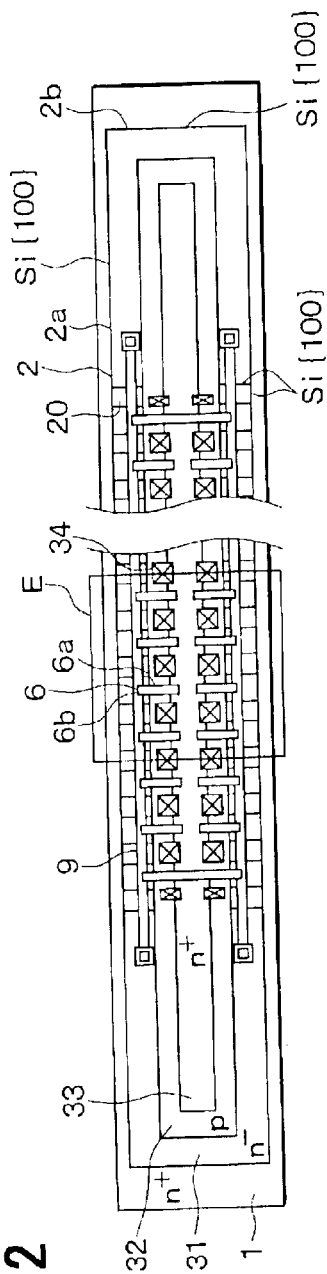
FIG. 12 is a plan view of a 3-D power MOSFET as a fourth example of the first embodiment.
Figure 13:
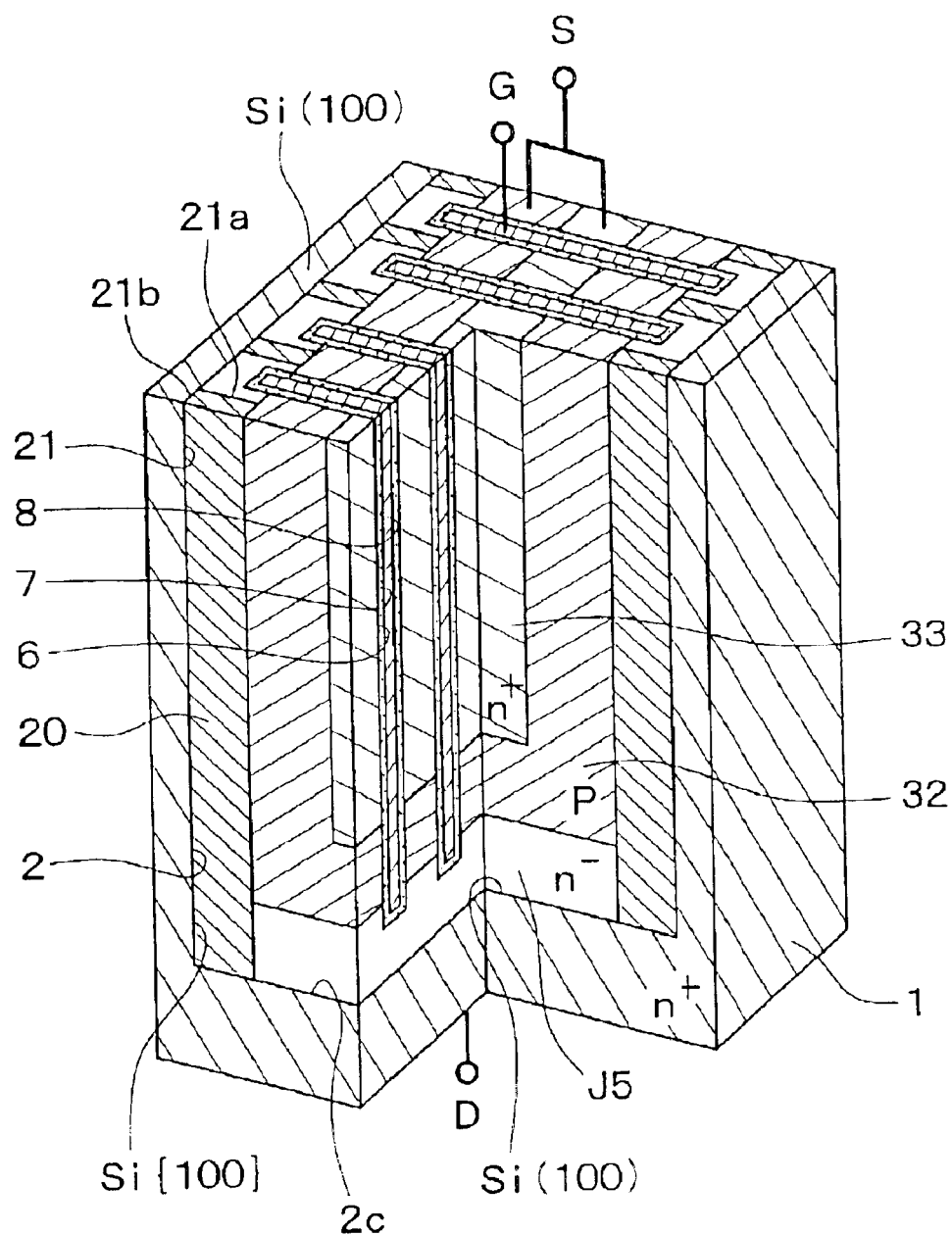
FIG. 13 is a perspective sectional view of the area E in FIG. 12.

FIG. 12 is a plan view of a 3-D power MOSFET as a fourth example of this embodiment. FIG. 13 is a perspective sectional view of the area E in FIG. 12. In the power MOSFET of the third example, the gate electrodes 8 are formed symmetrical to the source region 33. However, the gate electrodes 8 may be linked to one another in the source region 33 as in the fourth example. Further, RESURF layers 20 may be formed in the drift layer 31 to construct a so-called super junction structure as in the second example, as shown in FIGS. 12 and 13. The present invention can also be applied to this power MOSFET.

Second Embodiment

Figure 14:
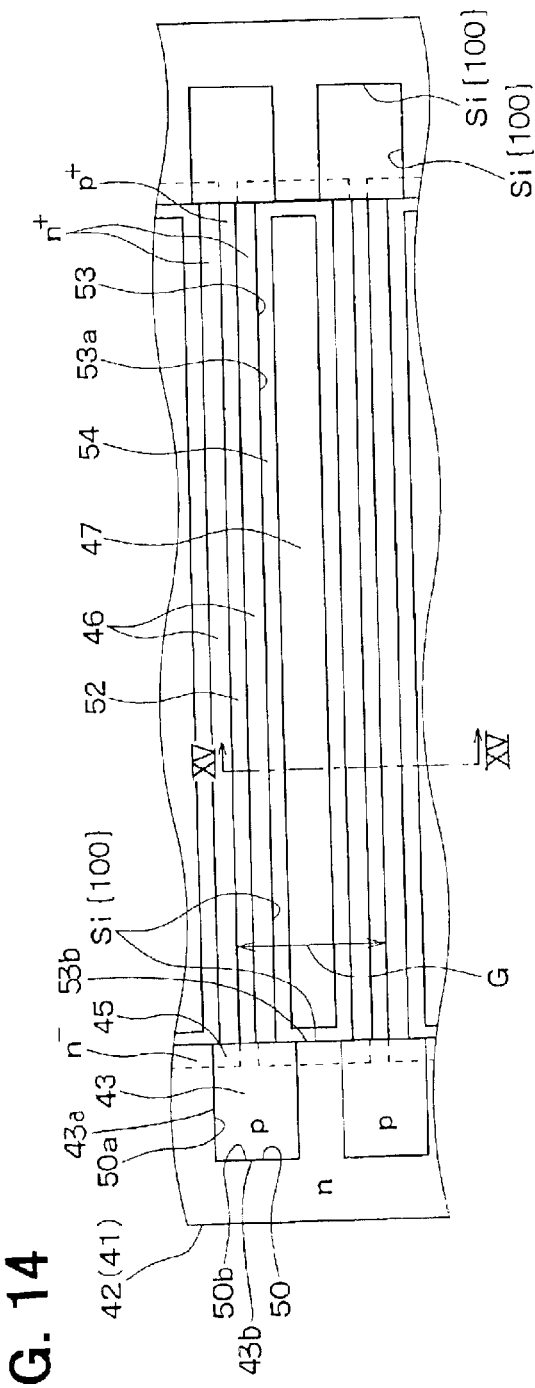
FIG. 14 is a plan view of a power MOSFET having a super junction structure as a first example of a second embodiment.
Figure 15:
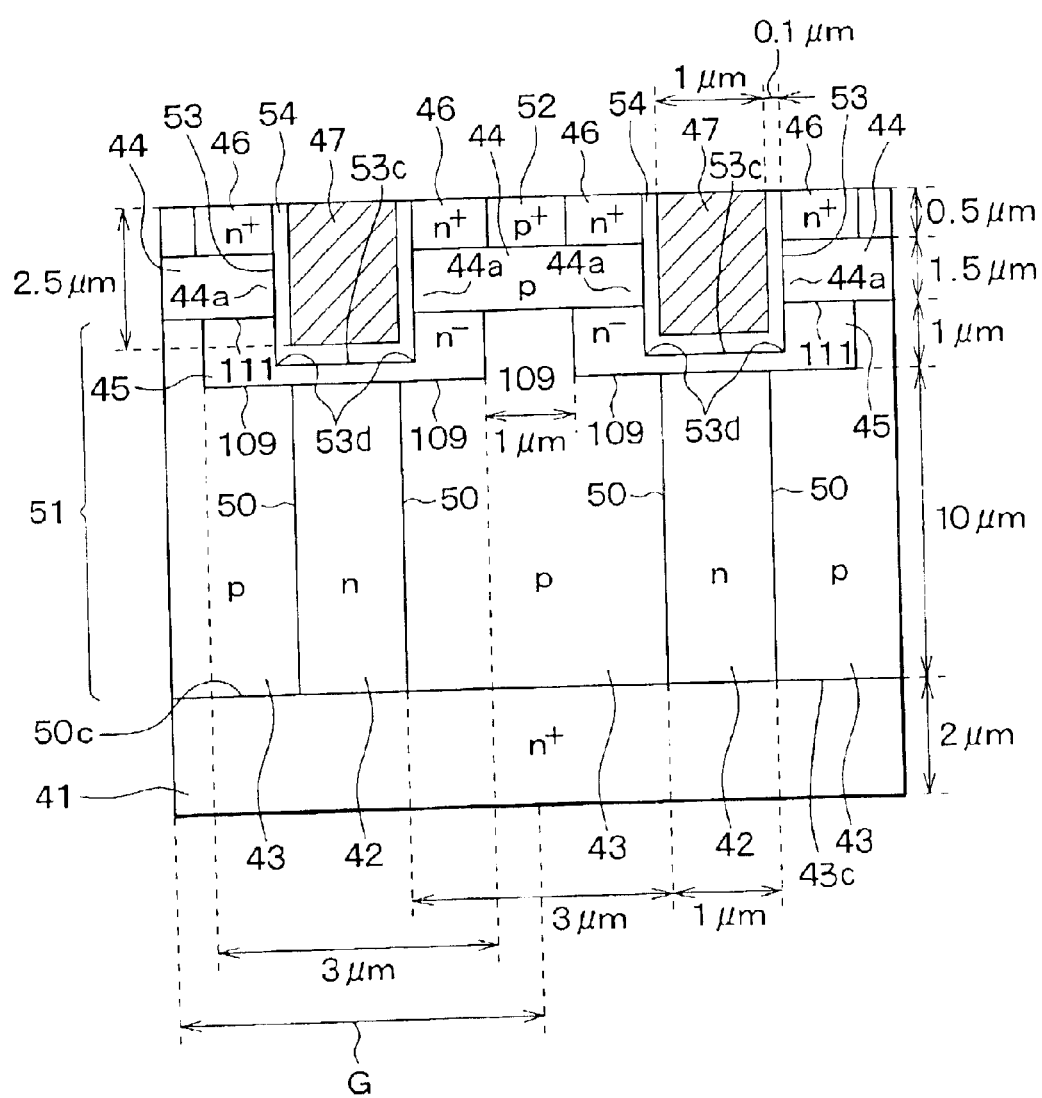
FIG. 15 is a cross-sectional view taken along the line XV—XV in FIG. 14.

FIG. 14 is a plan view of a power MOSFET having a super junction structure as a first example of a second embodiment of the present invention. FIG. 15 is a cross-sectional view taken along the line XV—XV in FIG. 14. The power MOSFET has a structure in which the unit structure G in FIG. 14 is repeated a plurality of times. The power MOSFET includes an n+-type substrate 41, which is a semiconductor substrate, and a p/n column layer 51. The p/n column layer 51 includes n-type drift regions 42 and p-type silicon regions 43, which are first semiconductor regions. The power MOSFET further includes p-type base regions 44, which are second semiconductor regions 44, upper n-type silicon regions 45, n+-type source regions 46, and gate electrodes 47.

The main surface of the n+-type substrate 41 is an Si(100) surface and the thickness of the substrate is, for example, 2 μm. The n+-type substrate 41 makes up an n+-type drain region. The n-type drift regions 42 are located on the n+-type substrate 41 and have crystallographically the same surface as that of the n+-type substrate 41. The n-type drift regions 42 have, for example, an impurity concentration of $2.8 \times 10^{16}$ cm$^{-3}$, a width of 1 μm, and a thickness of 10 μm. These values are selected to ensure that the n-type drift regions 42 can be completely depleted when a predetermined reverse voltage is applied. The n-type drift regions 42 and the n+-type substrate 41 make up another semiconductor substrate.

The n-type drift regions 42 define first trenches 50, or epitaxial trenches 50. The epitaxial trenches 50 is rectangular when viewed from above their entrances. In this embodiment, the long sidewall surfaces 50a and short sidewall surfaces 50b of the epitaxial trenches 50 are Si{100} surfaces. More specifically, one of a pair of the long sidewall surfaces 50a is an Si(001) surface and the other surface is an Si(00-1) surface. One of a pair of the short sidewall surfaces 50b is an Si(010) surface and the other surface is an Si(0-10) surface. The bottom surfaces 50c of the trenches 50 are parallel to the main surface of the n+-type substrate 41 and Si(100) surfaces. Thus, the surfaces defining the epitaxial trenches 50 are all Si{100} surfaces.

The p-type silicon regions 43 are located in the epitaxial trenches 50. The p-type silicon regions 43 have an impurity concentration of, for example, $1 \times 10^{16}$ cm$^{-3}$. The p-type silicon regions 43 have, for example, a width of 3 μm and a thickness of 10 μm. However, the p-type silicon regions 43 have, for example, a width of 1 μm at the portion between the upper n-type silicon regions 45, which are described later. The aforementioned values are selected to ensure that the p-type silicon regions 43 can be completely depleted when a predetermined reverse voltage is applied.

The bottom surfaces 43c and the sidewall surfaces 43a, 43b of the p-type silicon regions 43 are respectively crystallographically the same as the adjoining bottom surfaces 50c and the adjoining sidewall surfaces 50a, 50b of the epitaxial trenches 50, that is, Si{100} surfaces. The n-type drift regions 42 and the p-type silicon regions 43 are arranged alternately in the directions orthogonal to the moving direction of carriers, that is, in the horizontal directions in FIG. 15. In other words, the n-type drift regions 42 and the p-type silicon regions 43 join at the corresponding pn junctions 50, which are the sidewall surfaces of the epitaxial trenches 50.

The pn junctions 50 are formed intermittently in horizontal directions by the alternate arrangement of the n-type drift regions 42 and the p-type silicon regions 43. Out of the interfacial surfaces 50a, 50b between the n-type drift regions 42 and the p-type silicon regions 43, the long interfacial surfaces 50a that are orthogonal to the horizontal direction are Si{100} surfaces. A so-called super junction structure 51 is formed by the alternate arrangement of the n-type drift regions 42 and the p-type silicon regions 43.

The p-type base regions 44 are located on the corresponding p-type silicon regions 43 in direct contact with the p-type silicon region 43. The p-type base regions 44 have, for example, an impurity concentration of $5 \times 10^{16}$ cm$^{-3}$ and a thickness of 1.5 μm. A p+-type base contact region 52 having a thickness of 0.5 μm is located on the upper surface of each of the p-type base regions 44. The upper n-type silicon regions 45 are located between the top surfaces of the n-type drift regions 42 and the lower surfaces of the p-type base regions 44 and between the n-type drift regions 42 and the bottom surfaces 53c of gate trenches 53, which are second trenches 53. The upper n-type silicon regions 45 are arranged to include substantially all the carrier passages that connect the n-type drift regions 42 and the p-type base regions 44.

In this embodiment, the upper n-type silicon regions 45 have, for example, an impurity concentration of $1 \times 10^{16}$ cm$^{-3}$, which differs from that of the n-type drift regions 42. However, the impurity concentration of the upper n-type silicon regions 45 may be $2.8 \times 10^{16}$ cm$^{-3}$, which is the impurity concentration of the n-type drift regions 42. The upper n-type silicon regions 45 are also in contact with the p-type base region 44 and further in contact with n-type channel regions 44a, at which n-type channels are formed in the p-type base regions 44. The upper n-type silicon regions 45 wider than the n-type drift regions 42 and the gate trench 53. The upper n-type silicon regions 45 have, for example, a width of 3 μm and a thickness of 1 μm. The upper n-type silicon regions 45 wider than the n-type drift regions 42 and the gate trench 53 substantially by the length of the n-type drift region 42 and the gate trench 53 on both sides in the horizontal directions of FIG. 15. The upper n-type silicon regions 45 define the corners 53d of the bottom surfaces of the gate trenches 53.

The n+-type source regions 46 are in contact with the top surfaces of the p-type base regions 44. The n+-type source regions 46 have a thickness of 0.5 μm. The gate electrodes 47 are located on the surfaces defining the gate trenches 53, which extend through the base region 44 from the main surface, with the gate oxide films 54, or gate insulating films 54, therebetween. As shown in FIG. 14, the gate trenches 53 are rectangular when viewed from above their entrances and parallel to the epitaxial trenches 50. That is, the long sidewall surfaces 53a of the gate trenches 53 are parallel to the long sidewall surfaces 50a of the epitaxial trenches 50 and are Si{100} surfaces. The thickness of the gate oxide films 54a on the sidewall surfaces of the gate trenches 53 is equal to that on the bottom surfaces of the gate trenches 53. In the sectional structure shown in FIG. 15, the gate electrodes 47 have, for example, a width of 1 μm and a depth of 2.5 μm. The gate oxide films 54 have a width of 0.1 μm.

Subsequently, the operation of the power MOSFET of this embodiment will be explained. Positive voltage is applied to the n+-type drain region 41 in FIG. 15, and the n+-type source regions 46 and the p+-type base contact regions 52 are grounded. When the power MOSFET is turned on in this state, that is, when positive voltage is applied to the trench gate electrodes 47, electrons in the p-type base regions 44 are drawn to the n-type channel regions 44a to form n-type channels. The electrons supplied from the n+-type source regions 46 flow in the n-type channel regions 44a, the upper n-type silicon regions 45, and the n-type drift regions 42 to reach the n+-type drain region 41.

Next, the method for manufacturing the semiconductor device according to this embodiment will be explained. FIGS. 16A to 16H show the process for manufacturing a semiconductor device according to this embodiment.

Figure 16A:
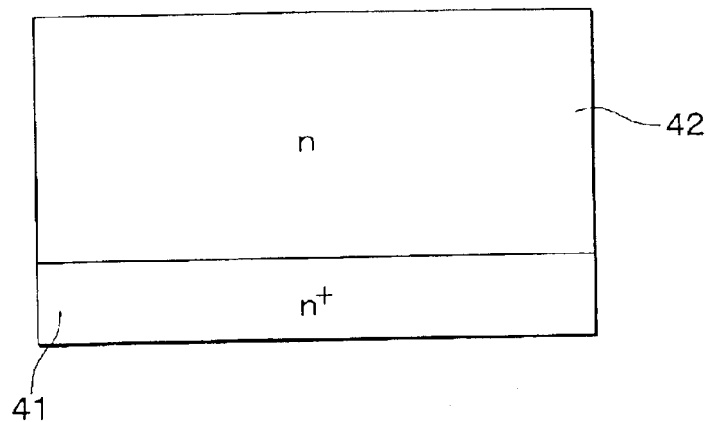
FIGS. 16A to 16H are views showing a method for manufacturing a power MOSFET having a super junction structure as a first example of a second embodiment.

[Steps Shown in FIG. 16A]

An n+-type substrate 41 that has an Si(100) surface as a main surface and makes up an n+-type drain region 41 is prepared. An n-type drift layer 42, which becomes n-type drift regions 42, is formed on the n+-type substrate 41 by epitaxial growth. The surface of the n-type drift layer 42 becomes an Si(100) surface.

Figure 16B:
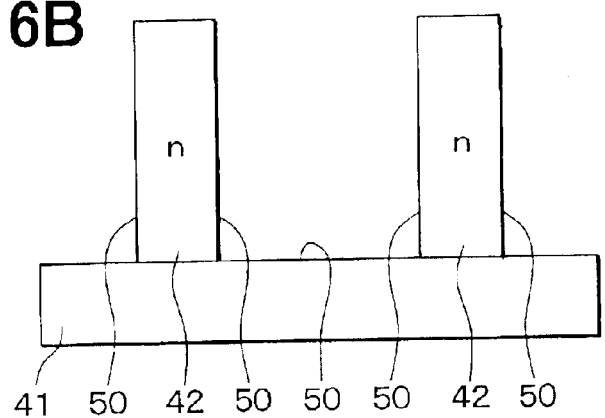

[Steps Shown in FIG. 16B]

Dry etching is carried out using a resist as a mask in the same manner as at the steps shown in FIG. 3B, FIG. 4 and FIG. 5 in the first embodiment. With the dry etching, epitaxial trenches 50, which reach the n+-type drain region 41 through the n-type drift layer 42, are formed. The epitaxial trenches 50 are formed such that the long sidewall surfaces 50a, the short sidewall surfaces 50b, and the bottom surfaces 50c of the epitaxial trenches 50 become Si{100} surfaces.

Figure 16C:
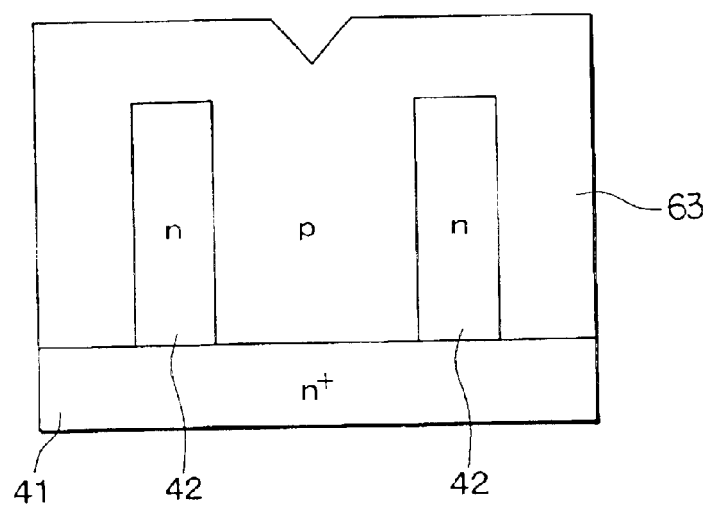

[Steps Shown in FIG. 16C]

Subsequently, a p-type silicon layer 63 is formed to fill the trenches 50 by epitaxial growth. At that time, since the bottom surfaces 50c and the sidewall surfaces 50a, 50b of the epitaxial trenches 50 are all Si{100} surfaces, the p-type silicon layer 63 grows at the same growth rate on the bottom surfaces 50c and the sidewall surfaces 50a, 50b.

Figure 16D:
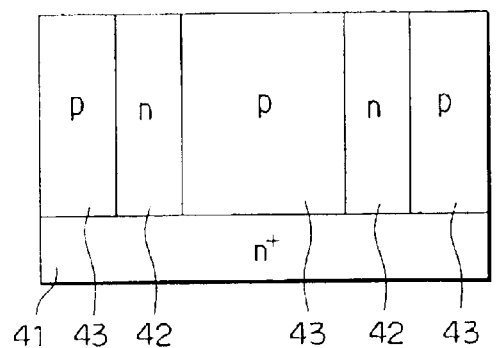
Figure 16E:
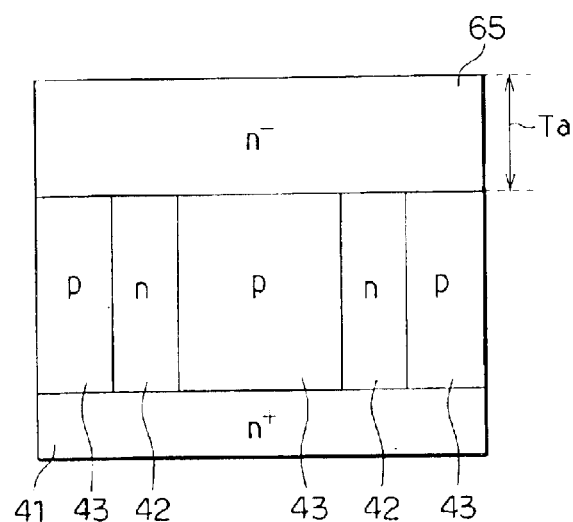

[Steps Shown in FIGS. 16D and 16E]

Then, as shown in FIG. 16D, the p-type silicon layer 63 is planarized by Chemical Mechanical Polishing (CMP) to the height of the top surfaces of the n-type drift regions 42 to form a p/n column layer 51. Thereafter, as shown in FIG. 16E, an n-type layer 65 having a thickness Ta is formed by epitaxial growth. The thickness Ta of the n-type layer 65 is equal to the total of the thickness of upper n-type silicon regions 45 and the thickness of p-type base regions 44, which are formed at later steps.

Figure 16F:
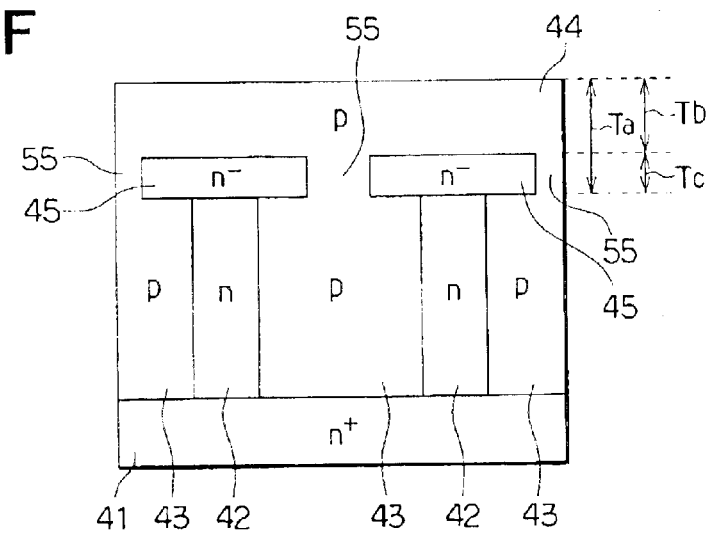

[Steps Shown in FIG. 16F]

A p-type impurity is added to the n-type layer 65 at the central area of the portions located on the p-type silicon regions 43 by ion implantation. As a result, p-type connection region 55 are formed, and the upper n-type silicon regions 45 defined by the p-type connection region 55 are formed at the same time. Then, a p-type impurity is added to the entire regions above the upper n-type silicon regions 45 by, for example, ion implantation. As a result, a p-type base layer 44, or a second semiconductor layer 44, from which p-type base regions 44 are formed, is formed. In the above ion implantation, the implanting speed and dose of ions are controlled to ensure that the thicknesses of the upper n-type silicon regions 45 and the p-type connection regions 55 become Tc and that the thickness of the p-type layer 44 becomes Tb.

Figure 16G:
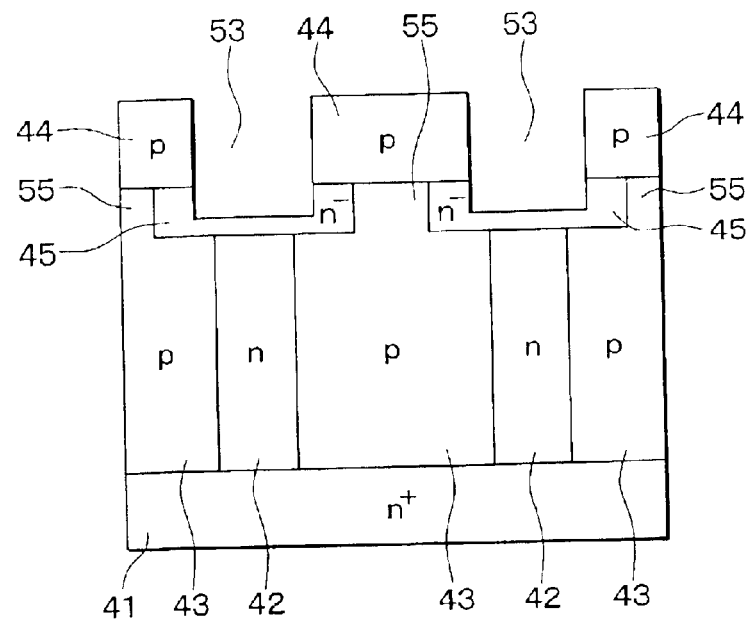

[Steps Shown in FIG. 16G]

Then, gate trenches 53 that reach the upper n-type silicon regions at their central areas 45 through the p-type base layer 44 are formed right above the n-type drift regions 42 by dry etching using a resist as a mask. At that time, as shown in FIG. 14, the gate trenches 53 are formed to extend parallel to the epitaxial trenches 50. That is, the long sidewall surfaces 53a of the gate trenches 53 and the long sidewall surfaces 50a of the epitaxial trenches 50 become parallel to each other. With the above arrangement, the long sidewall surfaces 53a of the gate trenches 53 become Si{100} surfaces. In other words, the surfaces of the p-type base regions 44 that define the gate trenches 53 become Si{100} surfaces. In this embodiment, as shown in FIG. 16G, the width of the gate trenches 53 is wider than the width of the n-type drift regions 42.

Figure 16H:
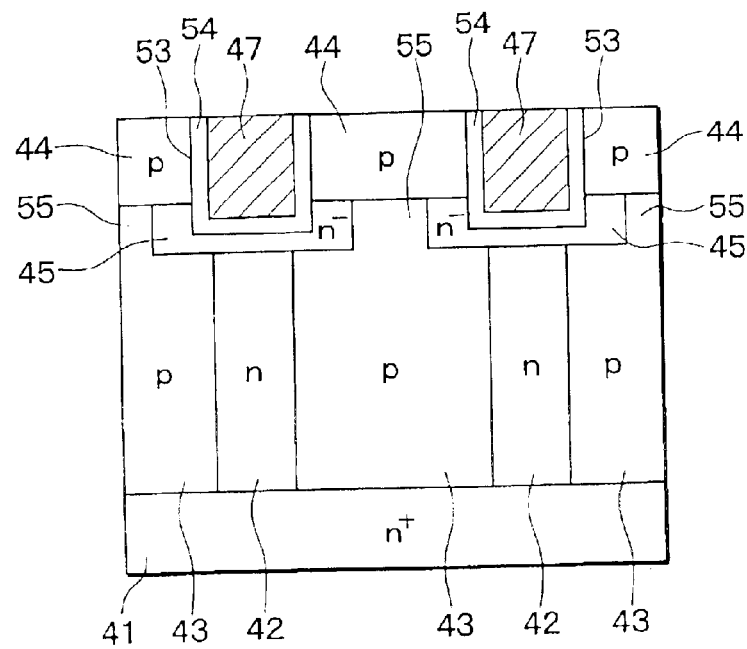

[Steps Shown in FIG. 16H]

Then, silicon oxide films 54 are formed on the sidewall surfaces and bottom surfaces of the gate trenches 53 by, for example, thermal oxidization. Thereafter, gate electrodes 47 made of polysilicon are formed on the silicon oxide films 54 by, for example, CVD. Finally, as shown in FIG. 15, n+-type source regions 46 are formed in the surfaces of the base layer 44 by, for example, implanting arsenic or phosphorus ions. Then, p+-type base contact regions 52 are formed in the surfaces of the base layer 44 by, for example, implanting boron ions. With the above steps, the power MOSFET shown in FIGS. 14 and 15 is manufactured.

In this embodiment, the epitaxial trenches 50 are formed at the step shown in FIG. 16B such that the surfaces defining the epitaxial trenches 50 are all Si{100} surfaces. Therefore, when the p-type silicon layer 63 is formed to fill the trenches 50 by epitaxial growth at the step shown in FIG. 16C, the p-type silicon layer 63 grows on the bottom surfaces and the sidewall surfaces of the epitaxial trenches 50 at the same growth rate. As a result, the generation of crystal defects is suppressed as in the first embodiment, and the p-type silicon regions 43 become to have an excellent crystallographic structure.

In this embodiment as well, the sidewall surfaces 53a, 53b and the bottom surfaces 53c of the gate trenches 53 have crystallographically the same plane orientation, so it is possible to equate the thickness of the gate oxide films 54 on the sidewall surfaces 53a, 53b with that on the bottom surfaces 53c when the gate oxide films 54 are formed by thermal oxidization. Therefore, if the device design is made based on the thickness of the gate oxide films 54 on the long sidewall surfaces 53a of the gate trenches 53, it is possible to thicken the gate oxide films 54 on the bottom surfaces 53c compared with the case explained in the background of the invention, in which the main surface of a substrate is an Si(100) surface and the sidewall surfaces and the bottom surfaces of the gate trenches are respectively Si{110} surfaces and Si{100} surfaces. Thus, it is possible to increase the breakdown voltage of the gate oxide films 54.

In addition, because the surfaces defining the gate trenches 53 are all Si{100} surface, that is, the channel surfaces are Si{100} surfaces, the density of the interface traps between the channel regions and the gate insulating films 54 and the electron mobility can be equal to those in the first embodiment. In this embodiment as well as the first embodiment, the epitaxial trenches 50 may be formed such that only the pairs of long sidewall surfaces 50a of the epitaxial trenches 50 are Si{100} surfaces. In addition, as long as the pairs of long sidewall surfaces 53a of the epitaxial trenches 53 are Si{100} surfaces, the short sidewall surfaces 53b of the epitaxial trenches 53 may not be Si{100} surfaces and may have other crystallographic planes. Even in that case, it is possible to improve the carrier mobility and increase the current flowing through the channel regions.

In this embodiment, the trenches formed in the n-type drift layer 42 are filled with the p-type silicon layer 63 to form the p/n column layer. However, the p/n column layer can be formed in the opposite order. That is, a p-type silicon layer 43 may be formed first, and then the trenches formed in the p-type silicon layer 43 may be filled with an n-type drift layer 42. In that case, the following steps are carried out in place of the steps of FIGS. 16A to 16C. First, a p-type silicon layer is formed on an n+-type substrate, the main surface of which is Si(100) surface, by epitaxial growth. Thereafter, a plurality of epitaxial trenches are formed in the p-type silicon layer in the same manner as shown in FIG. 16B. The surfaces defining the epitaxial trenches are all Si{100} surfaces.

Then, an n-type drift layer 42 is formed to fill the epitaxial trenches by epitaxial growth and planarized by CMP to form a p/n column layer 51, as shown in FIG. 16D. Thereafter, the steps shown in FIG. 16E and others are carried out. Even in that method, the n-type drift regions 42 are formed in the epitaxial trenches defined by surfaces that are all Si{100} surfaces, so it is possible to suppress the generation of crystal defects in the n-type drift regions 42. As a result, the n-type drift regions 42 become to have an excellent crystallographic structure.

Although the gate oxide films 54 are formed by thermal oxidation in this embodiment, the gate oxide films 54 may be formed by CVD. In addition, although the epitaxial trenches 50 and the gate trenches 53 are arranged to be parallel to each other in this embodiment, the epitaxial trenches 50 and the gate trenches 53 may be arranged to be orthogonal to each other, as explained below.

Figure 17:
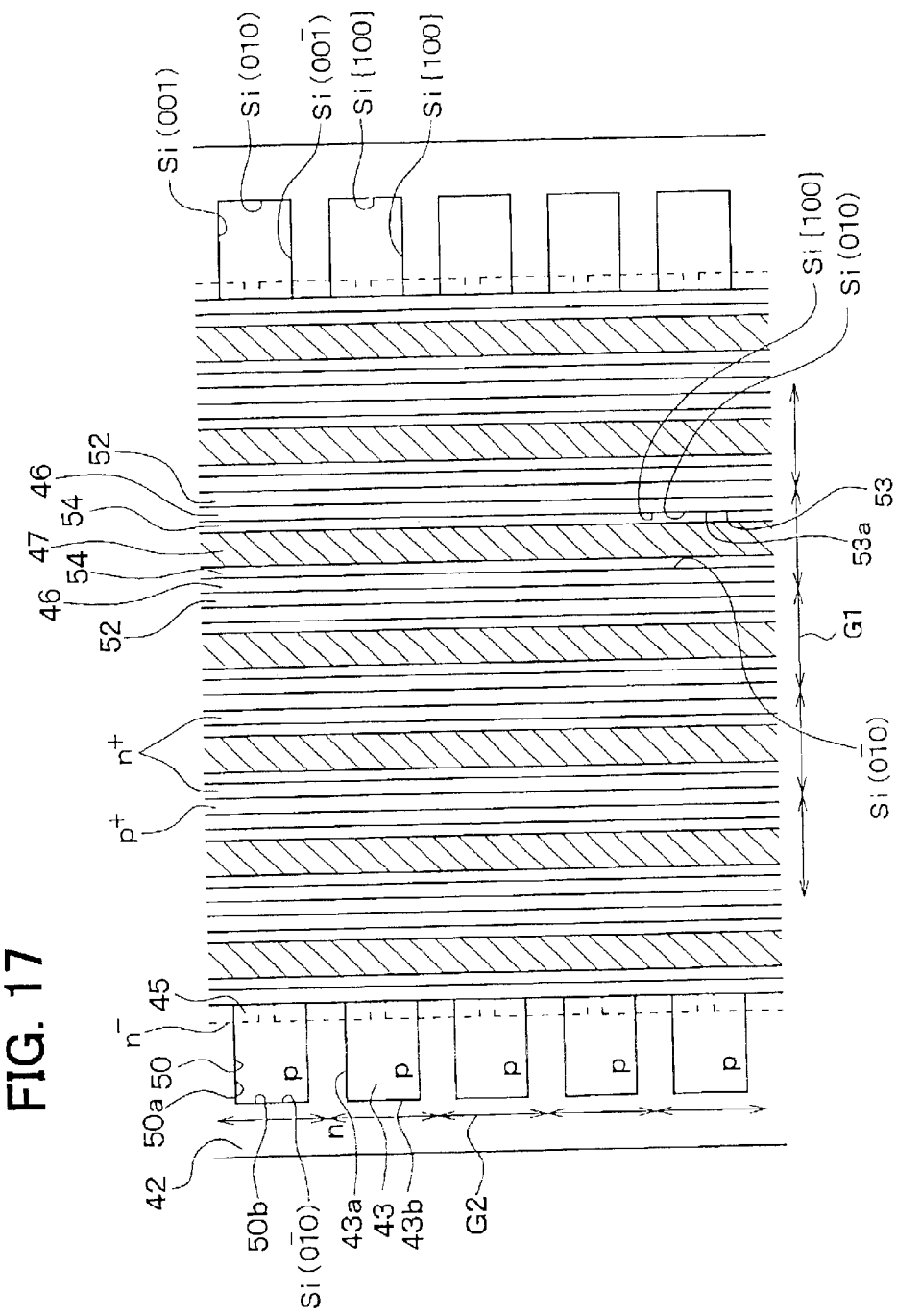
FIG. 17 is a plan view of a power MOSFET having a super junction structure as a second example of the second embodiment.

FIG. 17 is a plan view of a power MOSFET having a super junction structure as a second example of the second embodiment, and the same elements are denoted using the same symbols as in the power MOSFET of FIG. 14. The power MOSFET shown in FIG. 17 has a structure in which the unit structure G1 of FIG. 17 is repeated a plurality of times at the trench gate areas and the unit structure G2 of FIG. 17 is repeated a plurality of times at the p/n column areas.

In the power MOSFET shown in FIG. 17, gate trenches 53 are arranged such that the long sidewall surfaces 53a of the gate trenches 53 are orthogonal to the long sidewall surfaces 50a of epitaxial trenches 50. In addition, the long sidewall surfaces 53a of the gate trenches 53 are orthogonal to the short surfaces 53b of the gate trenches 53, although not shown in the figure. With this arrangement as well, it is possible to make all the surfaces defining the gate trenches 53 Si{100} surfaces.

In the first and second examples of this embodiment, upper n-type silicon regions 45 are located on n-type drift regions 42. However, the upper n-type silicon regions 45 may not be located on the n-type drift regions 42. In that case, the gate trenches 53 reach the n-type drift regions 42. However, the structure that the upper n-type silicon regions 45 are located on the n-type drift regions 42 is better than the structure that the upper n-type silicon regions 45 are not employed due to the following two reasons.

In the structure otherwise shown in FIG. 15, if the upper n-type silicon regions 45 are not employed, the corners 53d of the bottom surfaces of the gate trenches 53 are located in the p-type silicon regions 43. In that case, the breakdown voltage decreases because the electric field concentrates at the proximities of the corners 53d of the bottom surfaces of the gate trenches 53 located in the p-type silicon regions 43. On the other hand, if the upper n-type silicon regions 45 are located on the n-type drift regions 42 as shown in FIG. 15, the electric field does not concentrate in the p-type silicon regions 43, but in the upper n-type silicon regions 45. As a result, it is possible to increase the breakdown voltage in comparison with the case that the upper n-type silicon regions 45 are not employed.

In addition to that, even if an error happens in the mask alignment when the gate trenches 53 are formed, there are no problems as long as the gate trenches are located within the upper n-type silicon regions 45. For this reason, it is possible to decrease the influence of the alignment error on device performances.

Third Embodiment

In the second embodiment, a power MOSFET having a super junction structure is formed using a substrate that has an Si(100) surface as its main surface. On the other hand, in this embodiment, a power MOSFET having a super junction structure is formed using a substrate that has an Si{110} surface as its main surface.

Figure 18B:
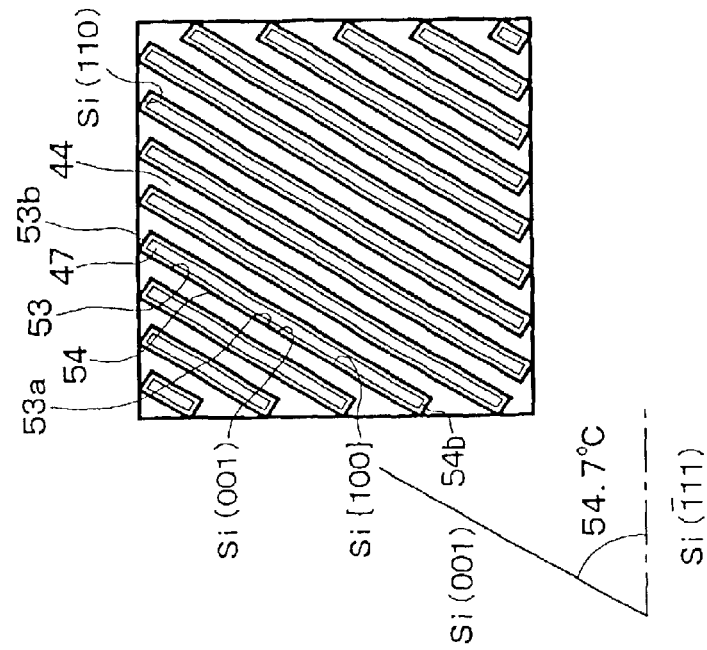
FIG. 18B is a plan view of the area 62 in FIG. 18A, showing the layout of trench gates.
Figure 18A:
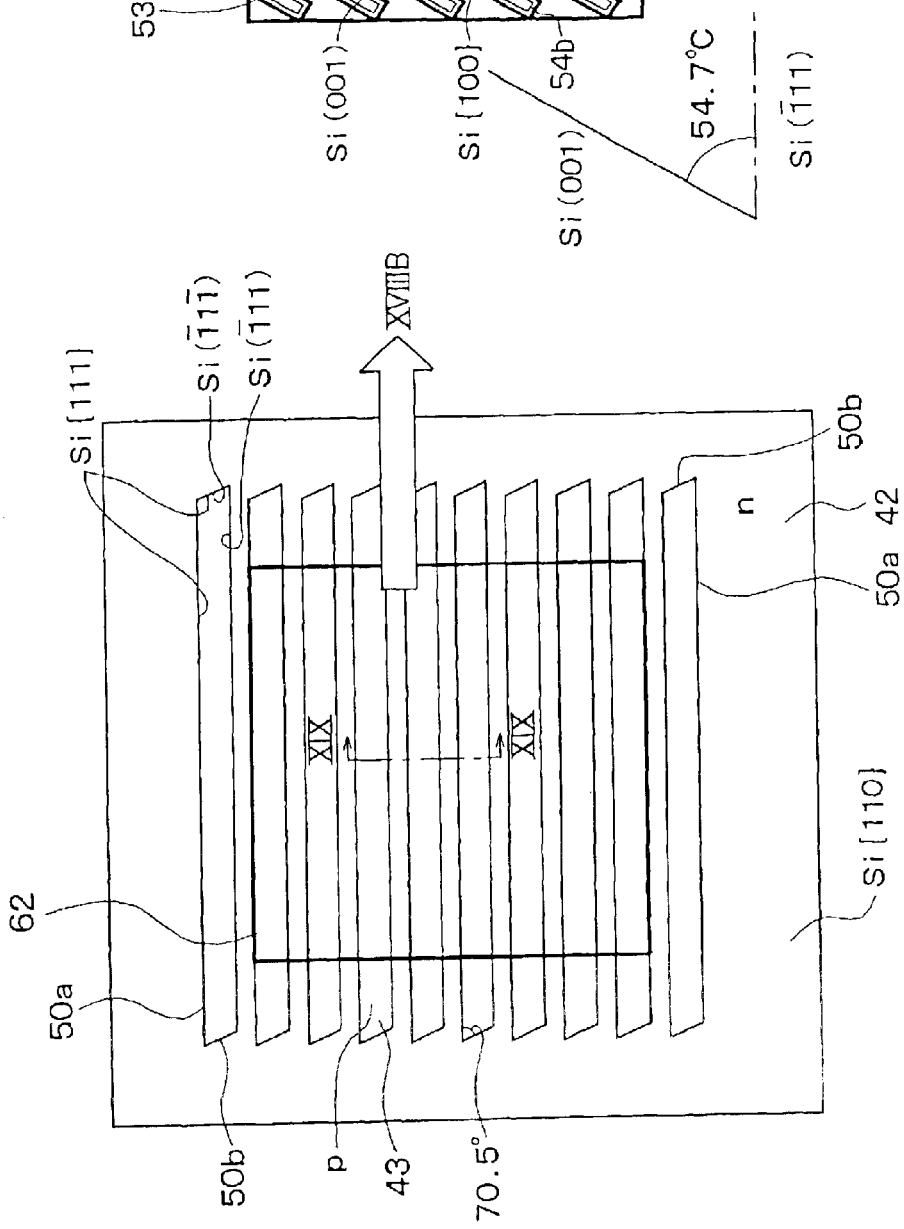
FIG. 18A is a plan view of a power MOSFET having a super junction structure as a third embodiment, showing the layout of a p/n column.
Figure 19:
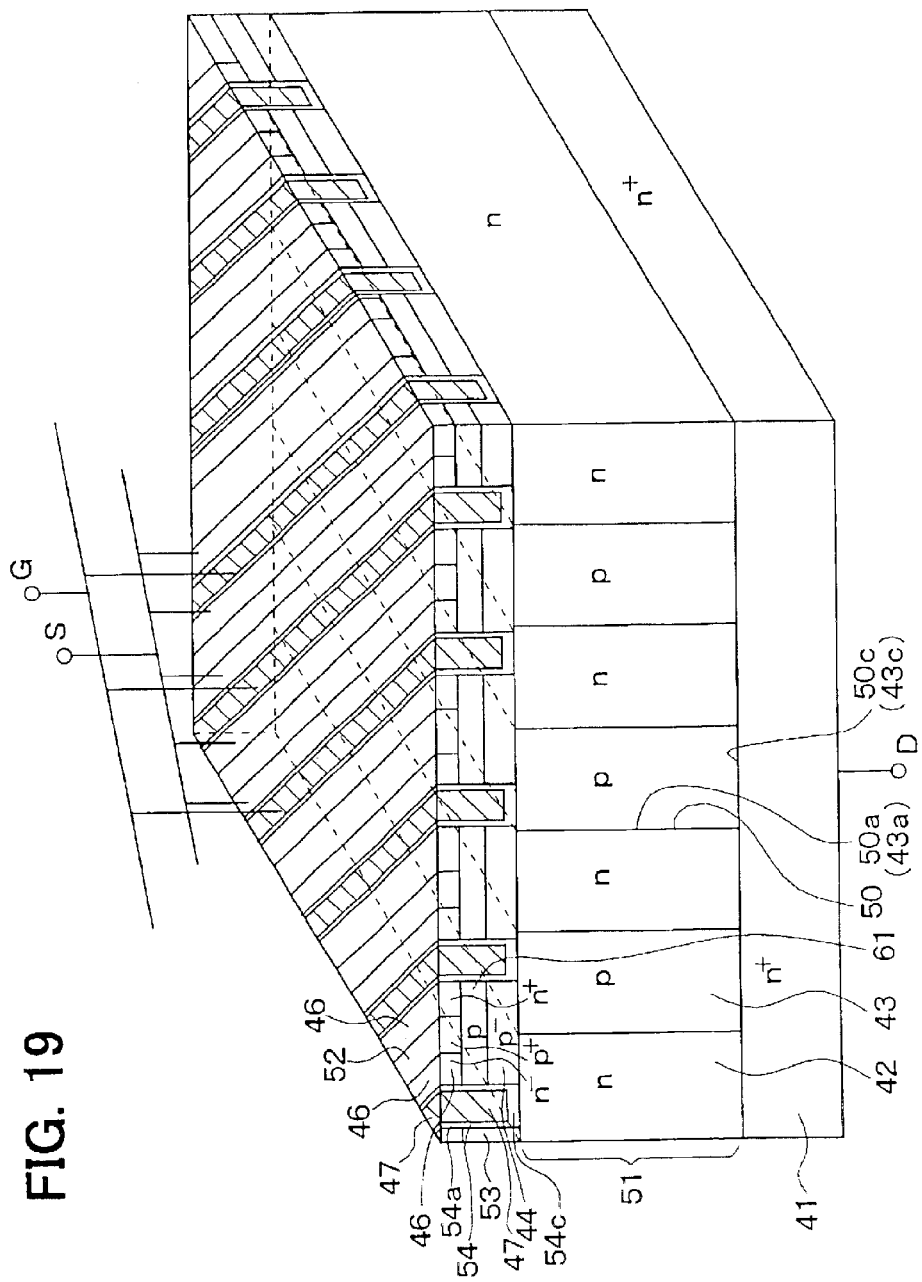
FIG. 19 is a perspective sectional view of the MOSFET in FIG. 18A, showing the cross-sectional view taken along the line XIX—XIX in FIG. 18A.

FIG. 18A is a plan view of a power MOSFET having a super junction structure as a third embodiment, showing the layout of p/n columns. FIG. 18B is a plan view of the area 62 in FIG. 18A, showing the layout of trench gates. FIG. 19 is a perspective sectional view of the MOSFET in FIG. 18A, showing the cross-sectional view taken along the line XIX—XIX in FIG. 18A. In FIGS. 18A, 18B, and 19, the same elements are denoted using the same symbols as in the power MOSFET of FIGS. 14 and 15.

The power MOSFET in this embodiment differs from those in the second embodiment in the crystallographic plane orientation of an n$^+$-type substrate 41 and the crystallographic plane orientations of the surfaces defining epitaxial trenches 50 and gate trenches 53. Specifically, the power MOSFET shown in FIGS. 21 and 22 includes an n$^+$-type substrate 41 that has an Si(100) surface as its main surface, a p/n column layer 51, P$^-$-type base regions 44, p-type channel regions 61, n$^+$-type source regions 46, and gate electrodes 47. This power MOSFET differs from those in the second embodiment in: that the base regions 44 are of P$^-$-type instead of P-type; that no upper n-type silicon regions 45 are employed; and that the p-type channel regions 61 are employed. The base regions 44 and the p-type channel regions 61 make up second semiconductor regions of second conductivity type in the present invention.

In this embodiment as well, the p/n column layer 51 is made up of n-type drift regions 42 and p-type silicon regions 43. The n-type drift regions 42 are located on the n$^+$-type substrate 41, and the upper and lower surfaces of the n-type drift regions 42 have crystallographically the same plane orientation as the upper surface of the n$^+$-type substrate 41 in FIG. 19. The p-type silicon regions 43 are formed by filling the epitaxial trenches 50 defined by the n-type drift regions 42 with an epitaxial growth film.

As shown in FIG. 18A, each of the epitaxial trenches 50 is a parallelogram, adjoining sides of which have a length different from each other and an internal angle of which is 70.5 degrees, when viewed from above their entrances. The epitaxial trenches 50 are arranged in a stripe pattern layout, in which the epitaxial trenches 50 extend parallel to one another. Each side of the parallelogram, that is, the long sidewall surfaces 50a and the short sidewall surfaces 50b are both Si{111} surfaces. Specifically, one of the long sidewall surfaces 50a is Si(-111) surface, and one of the short sidewall surfaces 50b is Si(-11-1) surface. The bottom surfaces 50c of the epitaxial trenches 50 are parallel to the upper surface of the n$^+$-type substrate 41 and Si(110) surface.

Therefore, the p-type silicon regions 43 located in the epitaxial trenches 50 are also arranged in a stripe pattern layout, in which the p-type silicon regions 43 in the shape of a thin parallelogram extend parallel to one another. The sidewall surfaces 43a, 43b and the bottom surface 43c of the p-type silicon regions 43 respectively have crystallographically the same plane orientations as the adjoining surfaces 50a, 50b and the bottom surface 50c of the epitaxial trenches 50.

Therefore, in this embodiment, out of the interfaces 50a, 50b between the n-type drift regions 42 and the p-type silicon regions 43, which make up the p/n column layer 51, the long sidewall surfaces 50a are Si{111} surfaces, and the short sidewall surfaces 50b are also Si{111} surfaces.

As shown in FIG. 18B, the gate electrodes 47 are arranged in a stripe pattern layout in an active area 62. The gate electrodes 47 are located on the surfaces defining the gate trenches 53, which extend from the surface to the p/n column layer 51 through the p-type channel regions 61 and the P⁻-type base regions 44, with the gate oxide films 54 therebetween. As shown in FIG. 18B, the gate trenches 53 are rectangular when viewed from above their entrance and in a stripe pattern layout. The gate trenches 53 are arranged such that the long sidewall surfaces 53a of the gate trenches 53 become Si{100} surfaces.

Specifically, the long sidewall surfaces 53a of the gate trenches 53 are Si(001) surfaces, and the short sidewall surfaces 53b of the gate trenches 53 are Si(110) surfaces. The long sidewall surfaces 53a of the gate trenches 53 are at an angle of 54.7 degrees with the long sidewall surfaces 50a of the epitaxial trenches 50. The gate oxide films 54 are thicker at the portions 54c located on the bottom surfaces 53c of the gate trenches 53 than at the portions 54a, 54b respectively located on the long and short sidewall surfaces 53a, 53b of the gate trenches 53.

As shown in FIG. 19, the n⁺-type source regions 46 and the p⁺-type base contact regions 52 are also arranged in a stripe pattern layout as well as the gate electrodes 47. As described above, the power MOSFET in this embodiment, the p-type silicon regions 43 and the gate electrodes 47 are arranged in a stripe pattern layout. However, the stripe pattern layouts are different in directions from each other.

Next, the method for manufacturing a semiconductor device in this embodiment will be explained. FIGS. 20A to 20G show a method for manufacturing the semiconductor device in this embodiment.

Figure 20A:
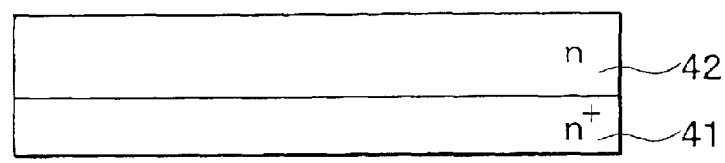
FIGS. 20A to 20G are views showing a method for manufacturing a power MOSFET having a super junction structure as the third embodiment.

[Steps Shown in FIG. 20A]

An n⁺-type substrate 41 that has an Si(100) surface as a main surface and makes up an n⁺-type drain region 41 is prepared. An n-type drift layer 42, which becomes n-type drift regions 42, is formed on the n⁺-type substrate 41 by epitaxial growth.

Figure 20B:
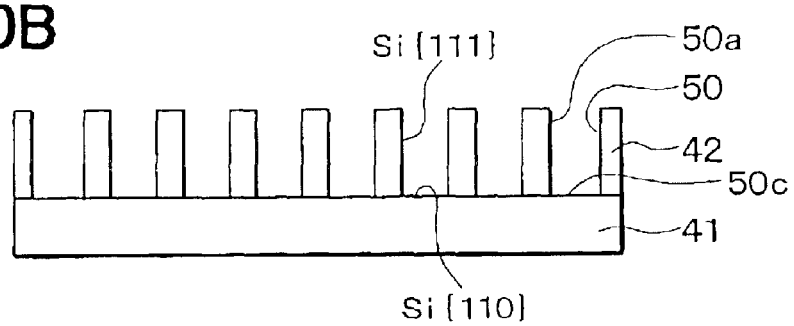

[Steps Shown in FIG. 20B]

Although not illustrated in the figure, a silicon oxide film is formed on a surface of the n-type drift layer 42 and patterned by photolithography. Then, the n-type drift layer 42 is etched using this patterned silicon oxide film as a mask to form epitaxial trenches 50, which are in the shape of, for example, a parallelogram when viewed from above their entrances, and to form n-type drift regions 42. The n-type drift layer 42 is anisotropically etched using an anisotropic wet etchant containing TMAH or KOH.

Figure 22:
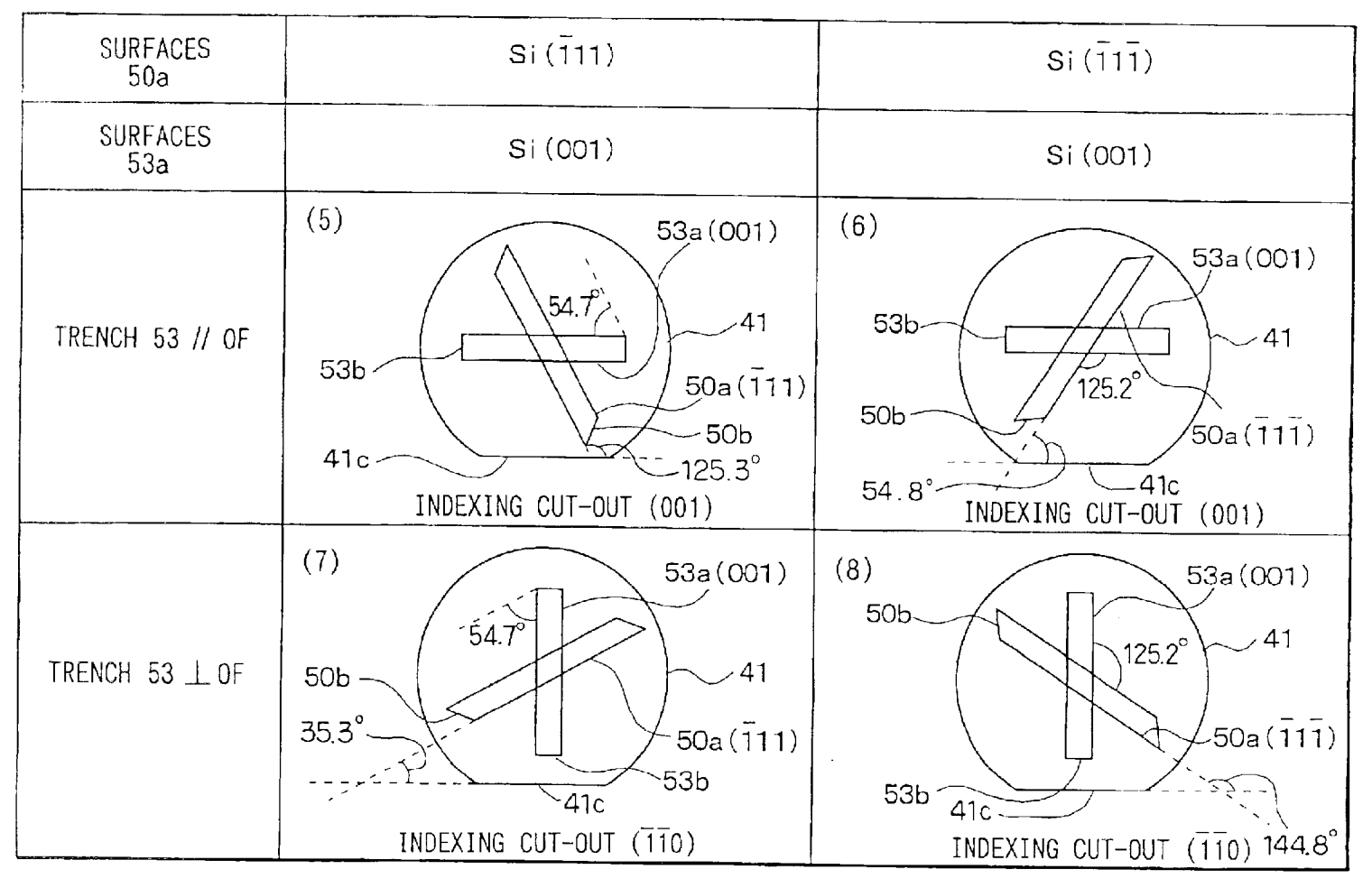

Here, an explanation will be made on the crystallographic planes that are exposed on the surfaces defining the epitaxial trenches 50. FIGS. 21 and 22 are tables that show the positional relations between the orientation flats 41c, the epitaxial trenches 50, and the gate trenches 53, on which a description will be made later, of semiconductor wafers. In FIG. 21, the orientation flats 41c are parallel or orthogonal to the long sidewall surfaces 50a of the epitaxial trenches 50 in consideration of the readiness in mask designing. In FIG. 22, the orientation flats 41c are parallel or orthogonal to the long sidewall surfaces 53a of the gate trenches 53 in consideration of the readiness in mask designing. In FIGS. 21 and 22, "OF" stands for orientation flat.

The following is an example for the formation of the epitaxial trenches 50, in which epitaxial trenches 50 are formed in the positional relations shown in (1) of FIG. 21.

In (1) of FIG. 21, a semiconductor wafer 41 has an Si(110) surface and an Si(-111) surface as a main surface and an orientation flat 41c, respectively. Epitaxial trenches 50 are formed such that the long sidewall surfaces 50a of the epitaxial trenches 50 are parallel to the orientation flat 41c and the short sidewall surfaces 50b of the epitaxial trenches 50 are at an angle of 109.5 degrees with the orientation flat 41c when measured counterclockwise from the orientation flat 41c. With this arrangement, the long sidewall surfaces 50a and the short sidewall surfaces 50b become Si(-111) surfaces and Si(-11-1) surfaces, respectively. That is, the sidewall surfaces 50a, 50b become Si{111} surfaces.

The bottom surfaces 50c of the epitaxial trenches 50 are formed to become Si(110) surfaces by forming the epitaxial trenches 50 such that the bottom surfaces 50c become parallel to the main surface. The width of the epitaxial trenches 50 is set to be 0.1 to 50 μm. The depth of the epitaxial trenches 50 is set to be 1 to 50 μm and smaller than the thickness of the n-type drift regions 42. After the epitaxial trenches 50 are formed, the silicon oxide film that has been used as an etching mask is removed by etching using a hydrofluoric acid aqueous solution.

Figure 20C:
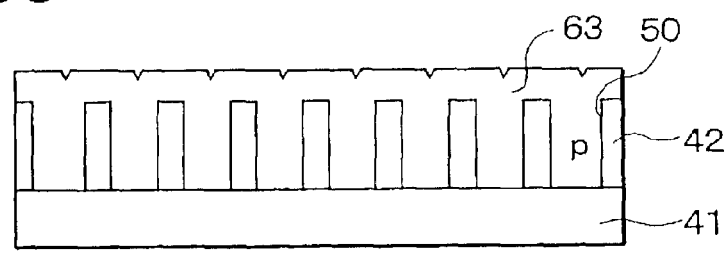

[Steps Shown in FIG. 20C]

Then, a p-type silicon layer 63 is deposited to fill the epitaxial trenches 50 by epitaxial growth using LP—CVD.

Figure 20D:
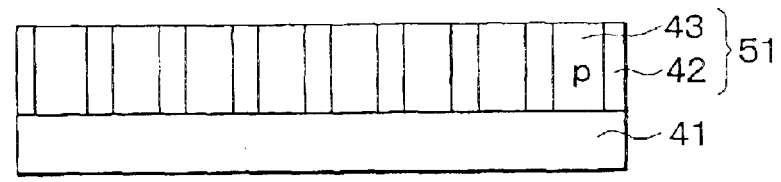

[Steps Shown in FIG. 20D]

The p-type silicon layer 63 is planarized by polishing it to the same height as the n-type drift regions 42 using CMP. With the planarization, a p/n column layer 51, which are made up of the n-type drift regions 42 and p-type silicon regions 43, is formed. Instead of CMP, the p-type silicon layer 63 may be planarized by etchback using dry etching.

Figure 20E:
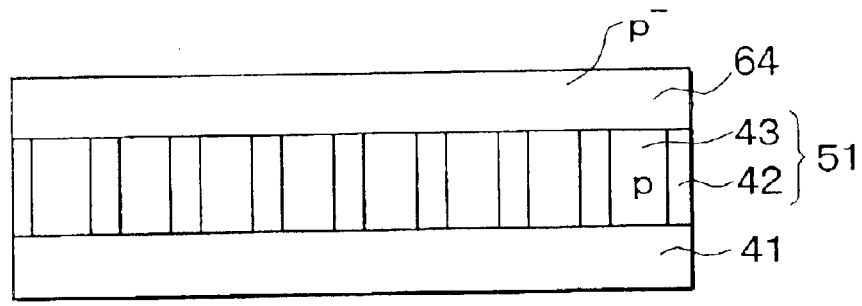

[Steps Shown in FIG. 20E]

Next, a p-type silicon layer 64, which becomes p-type base regions 44, is deposited on the p/n column layer 51 by epitaxial growth using LP—CVD.

Figure 20F:
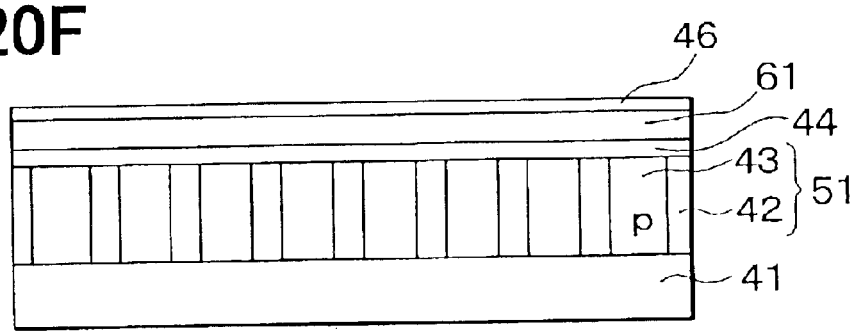

[Steps Shown in FIG. 20F]

Then, a p-type channel layer 61, which becomes p-type channel regions 61, and an n⁺-type source layer 46, which becomes n⁺-type source regions 46, are formed by ion implantation and thermal diffusion. The steps shown in FIGS. 20C to 20F can be modified. For example, it is possible to omit the steps shown in FIG. 20E by leaving the p-type silicon layer 63 above the n-type drift regions 42, not completely removing the p-type silicon layer 63 above the n-type drift regions 42. In that case, the p-type silicon layer 63 can be used as a p-type channel layer 61.

It is also possible to directly form a p-type channel layer 61 and an n⁺-type source layer 46 in a surface of a p/n column layer 51 by implanting ions into the p/n column layer 51 after the steps shown in FIG. 20D without the steps shown in FIG. 20E.

Figure 20G:
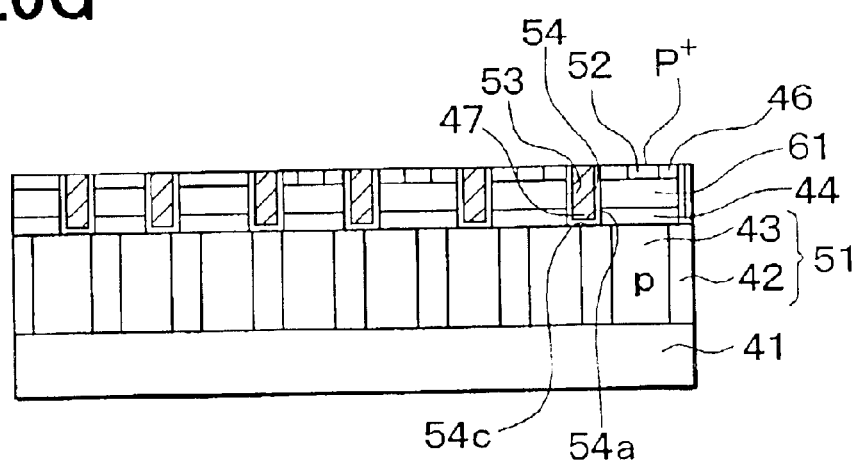

[Steps Shown in FIG. 20G]

Then, gate trenches 53 for gate electrodes are formed by etching. The etching is a dry etching using RIE. The gate trenches 53 are formed to become rectangular when viewed from above their entrances. The long sidewall surfaces 53a and the bottom surfaces 53c of the gate trenches 53 are Si{100} surfaces and Si(110) surfaces, respectively. Specifically, when the orientation flat 41C of the n⁺-type substrate 41 is Si(-111) surface, the gate trenches 53 are formed such that the long sidewall surfaces 53a are at an angle of 54.7 degrees with the orientation flat 41C, as shown in (1) of FIG. 21. With this arrangement, the long sidewall surfaces 53a become Si(001) surfaces, that is, Si{100} surfaces. The short sidewall surfaces 53b of the gate trenches 53 are arranged to be orthogonal to the long sidewall surfaces 53a. With this arrangement, the short sidewall surfaces 53b become Si(110) surfaces as well as the bottom surfaces 53c of the gate trenches 53.

Subsequently, gate oxide films 54 are formed on the surfaces defining the gate trenches 53 by thermal oxidization. Then, gate electrodes 47 are formed on the surfaces defining the gate trenches 53 with the gate oxide films 54 therebetween. P⁺-type base contact regions 52 are formed in the n⁺-type source layer 46. Then, although not illustrated in the figure, source electrodes, drain electrodes, and so on are formed to complete a power MOSFET show in FIGS. 18A, 18B, and 19.

In this embodiment, the epitaxial trenches 50 are formed by wet etching at the step shown in FIG. 20B. Therefore, it is possible to lessen the damage to the surfaces defining the epitaxial trenches 50 in comparison with the case that the epitaxial trenches 50 are formed by dry etching. As a result, it is possible to suppress the generation of crystallographic defects. Thus, when the p-type silicon layer 63 is formed to fill the epitaxial trenches 50 by epitaxial growth, it is possible to suppress the generation of crystallographic defects in the p-type silicon layer 63 in comparison with the case that the epitaxial trenches 50 formed by dry etching.

In addition, an etching bath capable of a batch wafer processing can be used for the above wet etching. Therefore, it is possible to reduce production costs in comparison with the case that the epitaxial trenches 50 are formed by dry etching such as RIE, which is usually a single wafer processing. Moreover, in this embodiment, the long sidewall surfaces 53a and the bottom surfaces 53c of the gate trenches 53 for the gate electrodes are Si{100} surfaces and Si{110} surfaces, respectively. That is, in the power MOSFET of this embodiment as well as the first and second embodiments, the channel surfaces are Si{100} surfaces.

FIG. 23 is a table that shows the electron mobility in the channel regions, the density of interface trap, and the relation in the thickness of the gate oxide film between on the sidewall surfaces and on the bottom surfaces of the power MOSFETs according to the first, second, and third embodiments. FIG. 23 also shows the same items with respect to the proposed method, which is described in the background section and in which the channel surfaces are Si{111} surfaces.

In this embodiment, the long sidewall surfaces 53a and the bottom surfaces 53c of the gate trenches 53 for the gate electrodes are Si{100} surfaces and Si{110} surfaces, respectively. Therefore, when the gate oxide films 54 are formed by thermal oxidation, the thickness of the gate oxide films 54c on the bottom surfaces 53c of the gate trenches 53 can be thicker than that of the gate oxide films 54a on the long sidewall surfaces 53a of the gate trenches 53.

In addition, since the short sidewall surfaces 53b of the gate trenches 53 are Si(110), the thickness of the gate oxide films 54c on the bottom surfaces 53c of the gate trenches 53 can be equal to that of the gate oxide films 54b on the short sidewall surfaces 53b of the gate trenches 53. Therefore, even if the devise designing is made on the basis of the thickness of the gate oxide films 54a on the long sidewall surfaces 53a of the gate trenches 53, it is possible to thicken the gate oxide films 54c on the bottom surfaces 53c of the gate trenches 53 in comparison with the case that the main surface is an Si(110) surface and the sidewall surfaces of the gate trenches are Si{111} surfaces, which is the case described in the background section. Therefore, it is possible to improve the breakdown voltage.

As shown in FIG. 23, when the channel surfaces are Si{111} surfaces as in the proposed method, the density of the interface traps between the channel regions and the gate insulating films is $1.7 \times 10^{11}$ cm⁻² and the electron mobility in the channel regions is 430 cm²/V*s. In contrast, in this embodiment, they are $2 \times 10^{10}$ cm⁻² and 600 cm²/V*s, respectively. In this embodiment, the channel surfaces are Si{100} surfaces, so it is possible to reduce the density of the interface traps and increase the electron mobility in comparison with the case that the channel surfaces are Si{111} surfaces.

Moreover, in this embodiment, the epitaxial trenches 50 and the gate trenches 53 are formed using a substrate, the main surface of which is Si(110) surface, in the arrangement shown in (1) of FIG. 21. However, the epitaxial trenches 50 and the gate trenches 53 can be formed in the arrangements shown in (2) to (4) of FIG. 21 and (5) to (8) of FIG. 22. In the arrangements shown in (2) to (8) of FIGS. 21 and 22, each of the epitaxial trenches 50 is a parallelogram, an internal angle of which is 70.5 degrees, when viewed from above their entrances, and the gate trenches 53 are rectangular when viewed from above their entrances. In (1) and (2) of FIG. 21, the orientation flat 41c is an Si{111} surface. In (3) and (4) of FIG. 21, the orientation flat 41c is an Si{112} surface. In (5) and (6) of FIG. 22, the orientation flat 41c is an Si{100} surface. In (7) and (8) of FIG. 22, the orientation flat 41c is an Si{110} surface.

As shown in (2) of FIG. 21, when the orientation flat 41c is an Si(-11-1) surface, the long sidewall surfaces 50a of the epitaxial trenches 50 are set to be parallel to the orientation flat 41c and the long sidewall surfaces 53a of the gate trenches 53 are set to be at an angle of 125.2 degrees with the orientation flat 41c. Here, the angle is defined as the one between the extended line of the orientation flat 41c and the extended line of each sidewall surface when measured counterclockwise from the orientation flat 41c. The same definition will be used hereinafter.

As shown in (3) of FIG. 21, when the orientation flat 41c is an Si(2-1-1) surface, the long sidewall surfaces 50a of the epitaxial trenches 50 are set to be orthogonal to the orientation flat 41c and the long sidewall surfaces 53a of the gate trenches 53 are set to be at an angle of 144.7 degrees with the orientation flat 41c.

As shown in (4) of FIG. 21, when the orientation flat 41c is an Si(121) surface, the long sidewall surfaces 50a of the epitaxial trenches 50 are set to be orthogonal to the orientation flat 41c and the long sidewall surfaces 53a of the gate trenches 53 are set to be at an angle of 35.2 degrees with the orientation flat 41c.

As shown in (5), (6) of FIG. 22, when the orientation flat 41c is an Si(001) surface, the long sidewall surfaces 50a of the epitaxial trenches 50 are set to be at an angle of 125.3 degrees or 54.8 degrees with the orientation flat 41c and the long sidewall surfaces 53a of the gate trenches 53 are set to be parallel to the orientation flat 41c.

As shown in (7), (8) of FIG. 22, when the orientation flat 41c is an Si(-1-10) surface, the long sidewall surfaces 50a of the epitaxial trenches 50 are set to be at an angle of 35.3 degrees or 144.8 degrees with the orientation flat 41c and the long sidewall surfaces 53a of the gate trenches 53 are set to be orthogonal to the orientation flat 41c.

In the arrangements shown in (1) and (3) of FIG. 21 and (5) and (7) of FIG. 22, the long sidewall surfaces 50a of the epitaxial trenches 50 become Si(-111) surfaces and the angles between the long sidewall surfaces 50a of the epitaxial trenches 50 and the long sidewall surfaces 53a of the gate trenches 53 become 54.7 degrees. In the arrangements shown in (2) and (4) of FIG. 21 and (6) and (8) of FIG. 22, the long sidewall surfaces 50a of the epitaxial trenches 50 become Si(-11-1) surfaces and the angles between the long sidewall surfaces 50a of the epitaxial trenches 50 and the long sidewall surfaces 53a of the gate trenches 53 become 125.2 degrees.

In this embodiment as well, the epitaxial trenches 50 may be formed such that only the long sidewall surfaces 50a of the epitaxial trenches 50 are Si{100} surfaces. In addition, as long as the long sidewall surfaces 53a of the epitaxial trenches 53 are Si{100} surfaces, the short sidewall surfaces 53b of the epitaxial trenches 53 may not be Si{100} surfaces and may have other crystallographic planes. Even in that case, it is possible to improve the carrier mobility and increase the current flowing through the channel regions in comparison with the proposed method.

In this embodiment, the trenches formed in the n-type drift layer 42 are filled with the p-type silicon layer 63 through the steps shown in FIGS. 20A to 20D to form the p/n column layer. However, the p/n column layer can be formed in the opposite order. That is, a p-type silicon layer 43 may be formed first on an n⁺-type substrate 41 by epitaxial growth, and then the trenches formed in the p-type silicon layer 43 may be filled with an n-type drift layer 42. In that case, the crystallographic plane orientations of the surfaces are set to be the same as in this embodiment.

Fourth Embodiment

Figure 24:
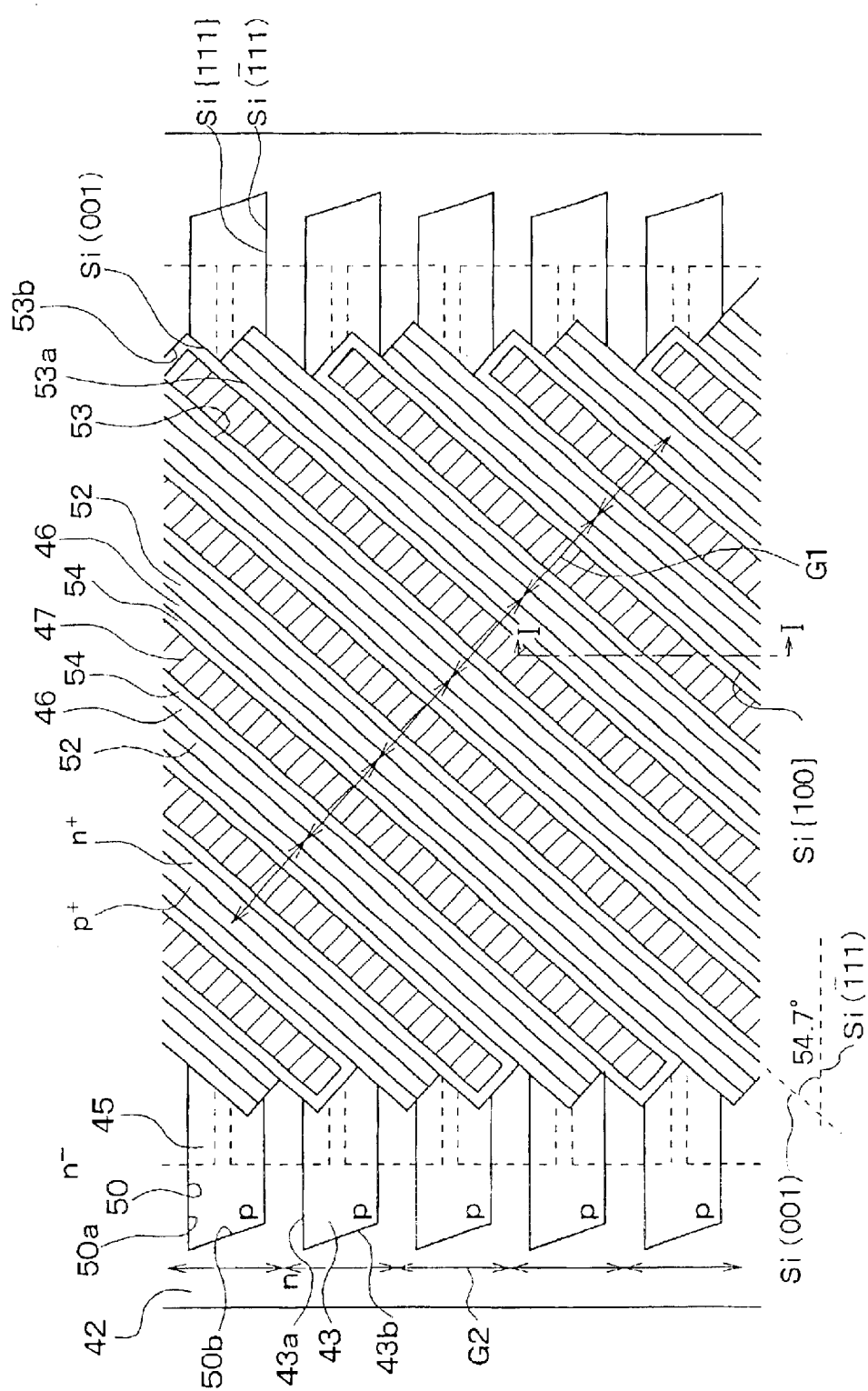
FIG. 24 is a plan view of a power MOSFET having a super junction structure as a fourth embodiment.

FIG. 24 is a plan view of a power MOSFET having a super junction structure as a fourth embodiment. The cross-sectional view taken along the line I–I' in FIG. 24 is similar to FIG. 14. In FIG. 24, the same elements are denoted using the same symbols as in FIGS. 17, 18A, 18B, and 19.

The power MOSFET according to this embodiment has the structure in which upper n-type silicon regions 45 are added to the power MOSFET shown in FIGS. 18a, 18b, and 19 such that the n-type silicon regions 45 are wider than the n-type drift regions 42 of a p/n column layer in the lateral directions and located on the p/n column layer 51. That is, the upper n-type silicon regions 45 can be added to the power MOSFET in the third embodiment such that the n-type silicon regions 45 are located between the p-type base regions 44, in which channels are formed, and the p/n column layer 51, as in the same manner shown in FIG. 14.

The method for manufacturing the power MOSFET in this embodiment basically differs from that in the second embodiment in the arrangement of the trench gates, and there are no differences in other aspects. Therefore, the explanation on the method is omitted.

Other Embodiment

In the second, third, and fourth embodiments, the n-type drift layer 42 are formed on the n⁺-type substrate 41 by epitaxial growth, and the epitaxial trenches 50 are formed in the n-type drift layer 42. However, an n-type substrate may be used instead of the n⁺-type substrate 41 and the n-type drift layer 42. In that case, the portion that is located within the same depth of the epitaxial trenches 50 from the surface functions as an n-type drift layer 42, and the rest of the n-type substrate becomes a drain region.

In each power MOSFET of the above embodiments is an n channel power MOSFET, in which the first conductivity type is n-type and the second conductivity type is p-type. However, the present invention can be applied to a p channel power MOSFET, in which the conductivity types of the elements are opposite to those in the n channel power MOSFET.

In the above embodiments, the present invention has been applied to power MOSFETs. However, the present invention can be applied to IGBT, in which a collector is substituted for the drain and an emitter is substituted for the source, and thyristor.

The foregoing invention has been described in terms of preferred embodiments. However, those skilled, in the art will recognize that many variations of such embodiments exist. Such variations are intended to be within the scope of the present invention and the appended claims.

What is claimed is:

1. A semiconductor device comprising:

a semiconductor substrate, which has a main surface that is an Si{110} surface;

a p/n column layer, which is made of first conductivity type drift regions and second conductivity type first semiconductor regions in a stripe pattern layout, wherein the p/n column layer is located on the semiconductor substrate;

second conductivity type second semiconductor regions, which are located on the p/n column layer, wherein the semiconductor device has trenches, which intersect the second semiconductor regions and each of which is defined by a bottom surface, two long sidewall surfaces that face each other, and two short sidewall surfaces that face each other;

gate insulating films, which have bean formed by thermal oxidization and are located on the surfaces defining the trenches; and gate electrodes, which are located on the gate insulating films, wherein out of interfacial surfaces between the drift regions and the first semiconductor regions, the long interfacial surfaces are Si{111} surfaces, wherein bottom surfaces of the drift regions and bottom surfaces of the first semiconductor regions are Si{110} surface, wherein the long sidewall surfaces of the trenches are Si{110} surfaces, wherein the short sidewall surfaces of the trenches are Si{110} surfaces, and wherein the bottom surfaces of the trenches are Si{110} surfaces.

* * * * *

UNITED STATES PATENT AND TRADEMARK OFFICE
CERTIFICATE OF CORRECTION

| | | |
|---|---|---|
| PATENT NO. | : 6,836,001 B2 | Page 1 of 1 |
| APPLICATION NO. | : 10/442196 | |
| DATED | : December 28, 2004 | |
| INVENTOR(S) | : Shoichi Yamauchi et al. | |

It is certified that error appears in the above-identified patent and that said Letters Patent is hereby corrected as shown below:

In the Claims:

Claim 1, Col. 24, lines 39-48, change

"gate electrodes, which are located on the gate insulating films, wherein out of interfacial surfaces between the drift regions and the first semiconductor regions, the long interfacial surfaces are Si{111} surfaces, wherein bottom surfaces of the drift regions and bottom surfaces of the first semiconductor regions are Si{110} surfaces, wherein the long sidewall surfaces of the trenches are Si{110} surfaces, wherein the short sidewall surfaces of the trenches are Si{110} surfaces, and wherein the bottom surfaces of the trenches are Si{110} surfaces."

to

-- gate electrodes, which are located on the gate insulating films, wherein out of interfacial surfaces between the drift regions and the first semiconductor regions, the long interfacial surfaces are Si{111} surfaces, wherein bottom surfaces of the drift regions and bottom surfaces of the first semiconductor regions are Si{110} surfaces, wherein the long sidewall surfaces of the trenches are Si{100} surfaces, wherein the short sidewall surfaces of the trenches are Si{110} surfaces, and wherein the bottom surfaces of the trenches are Si{110} surfaces. --

Signed and Sealed this
Twenty-eighth Day of May, 2013

Teresa Stanek Rea
*Acting Director of the United States Patent and Trademark Office*